US 011749675 B2

(12) United States Patent
Momota et al.

(10) Patent No.: US 11,749,675 B2
(45) Date of Patent: Sep. 5, 2023

(54) SEMICONDUCTOR DEVICE

(71) Applicants: FUJI ELECTRIC CO., LTD., Kawasaki (JP); DENSO CORPORATION, Kariya (JP)

(72) Inventors: Seiji Momota, Kawasaki (JP); Hitoshi Abe, Kawasaki (JP); Takashi Shiigi, Kawasaki (JP); Takeshi Fujii, Kawasaki (JP); Koh Yoshikawa, Kawasaki (JP); Tetsutaro Imagawa, Kawasaki (JP); Masaki Koyama, Kariya (JP); Makoto Asai, Kariya (JP)

(73) Assignees: FUJI ELECTRIC CO., LTD., Kawasaki (JP); DENSO CORPORATION, Kariya (JP)

( * ) Notice: Subject to any disclaimer, the term of this patent is extended or adjusted under 35 U.S.C. 154(b) by 350 days.

(21) Appl. No.: 17/143,247

(22) Filed: Jan. 7, 2021

(65) Prior Publication Data

US 2021/0134789 A1    May 6, 2021

Related U.S. Application Data

(62) Division of application No. 15/255,713, filed on Sep. 2, 2016, now Pat. No. 10,916,541, which is a division
(Continued)

(30) Foreign Application Priority Data

Jan. 29, 2008 (JP) .................................. 2008-018050
Jun. 19, 2008 (JP) .................................. 2008-160800

(51) Int. Cl.
*H01L 27/06* (2006.01)
*H01L 29/739* (2006.01)
(Continued)

(52) U.S. Cl.
CPC ...... *H01L 27/0629* (2013.01); *H01L 27/0658* (2013.01); *H01L 29/7395* (2013.01);
(Continued)

(58) Field of Classification Search
CPC ............. H01L 27/0629; H01L 27/0658; H01L 29/7395; H01L 29/7397; H01L 29/7815;
(Continued)

(56) References Cited

U.S. PATENT DOCUMENTS 4,449,158 A    5/1984  Taira
5,097,302 A    3/1992  Fujihira et al.
(Continued)

FOREIGN PATENT DOCUMENTS

CN    1430793 A    7/2003
CN    1921150 A    2/2007
(Continued)

OTHER PUBLICATIONS

International Search Report issued in PCT/JP2009/051328, dated Mar. 31, 2009; PCT/IPEA /416 dated Feb. 9, 2010 and PCT/IPEA/ 408 dated Oct. 20, 2009.
(Continued)

*Primary Examiner* — Igwe U Anya
(74) *Attorney, Agent, or Firm* — WHDA, LLP

(57) ABSTRACT

Between a source electrode (25) of a main device (24) and a current sensing electrode (22) of a current detection device (21), a resistor for detecting current is connected. Dielectric withstand voltage of gate insulator (36) is larger than a product of the resistor and maximal current flowing through the current detection device (21) with reverse bias. A diffusion length of a p-body region (32) of the main device (24) is shorter than that of a p-body (31) of the current detection device (21). A curvature radius at an end portion of the p-body region (32) of the main device (24) is smaller than
(Continued)

that of the p-body (31) of the current detection device (21). As a result, at the inverse bias, electric field at the end portion of the p-body region (32) of the main device (24) becomes stronger than that of the p-body region (31) of the current detection device (21). Consequently, avalanche breakdown tends to occur earlier in the main device 24 than the current detection device (21).

5 Claims, 38 Drawing Sheets

Related U.S. Application Data of application No. 12/865,330, filed as application No. PCT/JP2009/051328 on Jan. 28, 2009, now Pat. No. 9,466,711.

(51) Int. Cl.
*H01L 29/78* (2006.01)
*H01L 29/08* (2006.01)
*H01L 29/10* (2006.01)
*H01L 29/423* (2006.01)
*H01L 29/06* (2006.01)

(52) U.S. Cl.
CPC ...... *H01L 29/7397* (2013.01); *H01L 29/7815* (2013.01); *H01L 29/0696* (2013.01); *H01L 29/0878* (2013.01); *H01L 29/1095* (2013.01); *H01L 29/4236* (2013.01); *H01L 29/7827* (2013.01)

(58) Field of Classification Search
CPC ............. H01L 29/0696; H01L 29/0878; H01L 29/1095; H01L 29/4236; H01L 29/7827
USPC .......................................................... 257/48
See application file for complete search history.

(56) References Cited

U.S. PATENT DOCUMENTS

| | | | |
|---|---|---|---|
| 5,365,085 A | 11/1994 | Tokura et al. | |
| 5,442,216 A | 8/1995 | Gough | |
| 5,453,390 A | 9/1995 | Nishizawa et al. | |
| 5,559,355 A | 9/1996 | Yamazaki et al. | |
| 5,614,749 A | 3/1997 | Ueno | |
| 5,654,560 A | 8/1997 | Nishizawa et al. | |
| 5,821,580 A * | 10/1998 | Kuwahara | H01L 29/1095 257/E29.066 |
| 6,002,153 A | 12/1999 | Tsunoda et al. | |
| 6,153,896 A | 11/2000 | Omura et al. | |
| 6,180,966 B1 * | 1/2001 | Kohno | H01L 29/7397 257/378 |
| 7,709,890 B2 * | 5/2010 | Yoshimura | H01L 29/7813 257/330 |
| 9,466,711 B2 | 10/2016 | Momota et al. | |
| 2001/0054738 A1 | 12/2001 | Momota et al. | |
| 2003/0146493 A1 | 8/2003 | Tomomatsu | |
| 2004/0041171 A1 | 3/2004 | Ogura et al. | |
| 2005/0032287 A1 | 2/2005 | Nakazawa et al. | |
| 2005/0062105 A1 | 3/2005 | Nakamura et al. | |
| 2005/0082640 A1 * | 4/2005 | Takei | H02M 7/003 257/E29.198 |
| 2005/0179083 A1 | 8/2005 | Ogura et al. | |
| 2005/0263853 A1 | 12/2005 | Tomomatsu et al. | |
| 2006/0289928 A1 | 12/2006 | Takaya et al. | |
| 2007/0045727 A1 | 3/2007 | Shiraishi et al. | |
| 2007/0126070 A1 | 6/2007 | Hotta | |
| 2007/0215898 A1 | 9/2007 | Ozeki et al. | |
| 2007/0278566 A1 | 12/2007 | Ogura et al. | |
| 2009/0189219 A1 | 7/2009 | Shinbori et al. | |

FOREIGN PATENT DOCUMENTS

| | | |
|---|---|---|
| EP | 0778620 B1 | 8/2004 |
| JP | 4-355968 A | 12/1992 |
| JP | 6-013618 A | 1/1994 |
| JP | 6-029539 A | 2/1994 |
| JP | 8-008422 A | 1/1996 |
| JP | 9-219518 A | 8/1997 |
| JP | 9-293856 A | 11/1997 |
| JP | 9-298298 A | 11/1997 |
| JP | 10-107282 A | 4/1998 |
| JP | 11-17179 A | 1/1999 |
| JP | 2001-308327 A | 11/2001 |
| JP | 2002-016252 A | 1/2002 |
| JP | 2002-176177 A | 6/2002 |
| JP | 2003-31807 A | 1/2003 |
| JP | 2003-188382 A | 7/2003 |
| JP | 2003-229572 A | 8/2003 |
| JP | 2003-243656 A | 8/2003 |
| JP | 2004-022941 A | 1/2004 |
| JP | 2004-88001 A | 3/2004 |
| JP | 2005-57049 A | 3/2005 |
| JP | 2005-116822 A | 4/2005 |
| JP | 2005-191238 A | 7/2005 |
| JP | 2005-347289 A | 12/2005 |
| JP | 2006-49455 A | 2/2006 |
| JP | 2006-93459 A | 4/2006 |
| JP | 2006-245477 A | 9/2006 |
| JP | 2007-059636 A | 3/2007 |
| JP | 2007-158134 A | 6/2007 |
| JP | 2007-250672 A | 9/2007 |
| JP | 2007-266570 A | 10/2007 |
| JP | 2009-176884 A | 8/2009 |

OTHER PUBLICATIONS

Notification of Transmittal of Translation of the Internatoonal Preliminary Report on Patentability (Forms PCT/IB/338) of International Application No. PCT/JP2009/051328 dated Sep. 16, 2010 with Forms PCT/IPEA/409.
Chinese Office Action dated Jul. 26, 2011, issued in corresponding Chinese Patent Application No. 200980103495.8.
Japanese Office Action dated Jul. 24, 2012, issued in corresponding Japanese Patent Application No. 2009-551532 (4 pages).
Chinese Office Action dated Aug. 9, 2012, issued in corresponding Chinese Patent Application No. 200980103495.8.
Chinese Office Action dated Dec. 3, 2013, issued in corresponding Chinese Patent Application No. 201110414104.3 with partial English translation (8 pages).
Japanese Office Action dated Dec. 24, 2013, issued in corresponding Japanese Patent Application No. 2012-209555 (3 pages).
Japanese Office Action dated Feb. 18, 2014, issued in corresponding Japanese Patent Application No. 2012-274452 with partial translation (4 pages).
Chinese Office Action dated Oct. 17, 2014, issued in corresponding Chinese Application No. 201210441210.5; w/ English Translation. (8 pages).
Matsushita et al., "Blocking Voltage Design Consideration for Deep Trench MOS Gate High Power Devices", Proceedings of 1995 International Symposium on Power Semiconductor Devices & ICs, 1995, pp. 256-260; cited in Office Action dated Apr. 1, 2015.
Office Action dated Apr. 1, 2015 issued in corresponding Germany application No. 112009000253.6 (w/partial English translation).

* cited by examiner

FIG.34

| IGBT STRUCTURE | CONNECTION OF P-TYPE FLOATING LAYER | CONNECTION OF DUMMY TRENCH ELECTRODE | Device Withstand Voltage [V] |
|---|---|---|---|
| TRENCH TYPE | × | FLOATING | ~1240 |
| FIRST DUMMY TRENCH TYPE | P-TYPE FLOATING LAYER | FLOATING | ~1280 |
| SEVENTH DUMMY TRENCH TYPE | P-TYPE FLOATING LAYER | DUMMY TRENCH ELECTRODE | ~1280 |
| THIRD DUMMY TRENCH TYPE | P-TYPE FLOATING LAYER | EMITTER ELECTRODE | ~1330 |
| FOURTH DUMMY TRENCH TYPE | EMITTER ELECTRODE | FLOATING | ~1340 |
| FIFTH DUMMY TRENCH TYPE | EMITTER ELECTRODE | EMITTER ELECTRODE | ~1350 |
| SIXTH DUMMY TRENCH TYPE | GATE ELECTRODE | FLOATING | ~1360 |
| SECOND DUMMY TRENCH TYPE | GATE ELECTRODE | EMITTER ELECTRODE | ~1370 |

SEMICONDUCTOR DEVICE

CROSS-REFERENCE TO RELATED APPLICATION

This application is a Divisional of U.S. application Ser. No. 15/255,713, filed Sep. 2, 2016, and wherein a Divisional of U.S. application Ser. No. 12/865,330, filed Sep. 29, 2010, and wherein U.S. application Ser. No. 12/865,330 is a national stage application filed under 35 U.S.C. § 371 of International Application No. PCT/JP2009/051328, filed Jan. 28, 2009, which is based upon and claims the benefit of priority of the prior Japanese Patent Application No. 2008-018050, filed on Jan. 29, 2008 and Japanese Patent Application No. 2008-160800, filed on Jun. 19, 2008, the entire contents of which are incorporated herein by reference.

TECHNICAL FIELD

The present invention relates to a semiconductor device that detects current.

BACKGROUND ART

Among insulated gate semiconductor devices such as metal-oxide-semiconductor field-effect transistors (MOS-FET) and insulated gate bipolar transistors (IGBT), a technology has been disclosed where one semiconductor chip includes a main insulated gate semiconductor device (hereinafter, main device) and a small-size insulated gate semiconductor device for current detection (hereinafter, current detection device) that is separate from the main device and shares a gate and drain terminal with the main device (see, for example, Patent Documents 1, 2, and 3 below). A resistor for current detection is connected with a source terminal of the current detection device so that very small electrical current proportional to the current flowing through the main device is detected by a voltage drop at the resistor. According to the insulated gate semiconductor devices having such a current detection function (hereinafter, a semiconductor device with a current detection function), the current that flows through the current detection device and is proportional to the current flowing through the main device is detected by the resistor, whereby an alarm is set off or a protection circuit is activated when overcurrent flows in the insulated gate semiconductor device.

FIG. 35 is a plan view of a semiconductor device with a current detection function. FIG. 36 is a sectional view along a line A-A' depicted in FIG. 35. As depicted in these figures, generally, a current sensing electrode 2 of a current detection device 1 is on the same metal layer as a source electrode 5 of the main device and is separate from the source electrode 5. Between the current sensing electrode 2 and the source electrode 5, a resistor 10 for current detection is connected.

A gate insulator (not shown) and a gate electrode 3 of the current detection device 1 are deposited, respectively, on the same layer as a gate insulator (not shown) and a gate electrode 6 of the main device 4. A drift layer 7 and a drain electrode 8 are shared between the current detection device 1 and the main device 4. The gate electrode 3 of the current detection device 1 and the gate electrode 6 of the main device 4 are connected through a gate electric pad 9. In FIG. 36, a body region and a source region are omitted.

FIG. 37 is a sectional view of a conventional semiconductor device with a current detection function. As depicted in FIG. 37, in the conventional planar gate semiconductor device with a current detection function, an impurity density and a diffusion depth of a body region 12 of the main device 4 are substantially equivalent to the impurity density and the diffusion depth of a body region 11 of the current detection device 1, and curvatures of each edge part are also substantially the same. Further, an interval between adjacent body regions 12 of the main device 4 and an interval between adjacent body regions 11 of the current detection device 1 are substantially equivalent.

FIG. 38 is a sectional view of another example of a conventional semiconductor device with a current detection function. As depicted in FIG. 38, in a conventional trench gate semiconductor device with a current detection function, the depth and the width of a trench 14 of the main device 4 is substantially equivalent to the depth and the width of a trench 13 of the current detection device 1. An interval between adjacent trenches 14 of the main device 4 is substantially equivalent to an interval between adjacent trenches 13 of the current detection device 1. Further, the diffusion depth of a body region 12 of the main device 4 is equal to the diffusion depth of a body region 11 of the current detection device 1.

The impurity density of the body region 12 of the main device 4 is equal to an impurity density of the body region 11 of the current detection device 1. If part of the body region 12 and part of the body region 11 each are not connected with the source electrode 5 or are electrically isolated, the ratio of part of the body region 12 contacting the source electrode 5 is substantially equivalent to the ratio of part of the body region 11 contacting the current sensing electrode 2.

For an IGBT device which controls large amounts of power, there is a problem in that when extremely large current flows, the device is destroyed. When high voltage is applied or large current flows, gate voltage becomes unstable causing non-uniform current or current oscillation. For an IGBT having a current detection function, there is a problem in that delay of protection or unstable oscillation is likely to occur because a feedback loop starting from detection of large current up to reduction of the gate voltage is long.

To address these problems, in a trench gate IGBT structure in which a gate electrode is buried in a trench, an electrode having a similar structure to the trench gate electrode is implanted and is electrically connected to an emitter electrode, which is called a dummy trench IGBT structure (see for example Patent Document 4 below). According to the dummy trench IGBT structure, the potential of the implanted electrode is identical to that of the emitter. Consequently, negative charge generated at an ineffective gate electrode (implanted electrode) can be removed and the influence of the negative charge can be prevented. Therefore, the gate voltage becomes stable even when high voltage is applied or large current flows, and non-uniform current or current oscillation is prevented. Thus, the destruction of the device is prevented even when extremely large current flows.

A conventional semiconductor device having a dummy trench structure and a current detection function is explained. FIG. 39 is a cross-sectional view illustrating a structure of the conventional semiconductor device having a dummy trench structure and a current detection function. As depicted in FIG. 39, in the conventional semiconductor device having a dummy trench structure and a current detection function, a main device 4 and a current detection device 1 both have a dummy trench IGBT structure (hereinafter "first dummy trench structure") 101. In the case of an IGBT, a body region, a drain electrode, and a source electrode are called a base region, a collector electrode, and an emitter electrode, respectively. The current detection device 1 is formed on the same semiconductor substrate as the main device 4. Therefore, the current detection device 1 and the main device 4 share an n-drift layer 7, a p-collector layer 62, and a collector electrode 8.

Both the current detection device 1 and the main device 4 have multiple trenches on a surface opposite to the n-drift layer 7 and the collector electrode 8. In the trenches, trench gate electrodes 73 and 74 and dummy trench electrodes 75 and 76 are formed where gate electrodes 3 and 6, electrodes made of polycrystalline silicone or the like, are implanted with a gate insulating film flanked by the trench and the electrode. The trench gate electrode 73 and 74 are electrically connected to a gate terminal. The dummy trench electrodes 75 and 76 are not connected to the gate terminal. Since the IGBT controls main current at the gate, the dummy trench electrodes 75 and 76 that are not connected to the gate terminal do not contribute to the control.

In regions between the trench gate electrodes 73 and between trench gate electrodes 74, base regions 56 and 12 are formed. On the surface of the base regions 56 and 12, n+ source regions 55 and 58 are selectively formed so that the n+ source regions 55 and 58 touches the trench gate electrodes 73 or 74. Emitter electrodes 2 and 5 touch the base regions 56 and 12 and the n+ source regions 55 and 58, respectively. P-type floating layers 71 and 72 are formed between the trench gate electrode 73 and the dummy trench electrode 75, between the trench gate electrode 74 and the dummy trench electrode 76, between the dummy trench electrodes 75, and between the dummy trench electrodes 76. Since the p-type floating layers 71 and 72 are separate from the electrodes 2 and 5 with interlayer insulating films 57 and 60 therebetween, the p-type floating layers 71 and 72 are electrically isolated from the emitter electrodes 2 and 5.

As depicted in FIG. 39, the trench gate electrodes 73 of the current detection device 1 and the trench gate electrodes 74 of the main device 4 are electrically connected to each other. As a result, the trench gate electrodes 73 and 74 are driven simultaneously. On the other hand, the emitter electrode 2 of the current detection device 1 and the emitter electrode 5 of the main device 4 are separated. Thus, the path of main current of the current detection device 1 and of the main device 4 are different. In addition, although not shown, the dummy trench electrodes 75 and 76 are connected to, for example, the emitter electrodes 2 and 5 or the p-type floating layers 71 and 72 in order to stabilize the potential.

In FIGS. 37 to 39, the size of the main device 4 is approximately equal to the current detection device 1 but actually, the surface area of the current detection device 1 is several tenths smaller than that of the main device 4. Therefore, reflecting the ratio of the surface areas, the current that flows through the current detection device 1 is several percent of that flowing through the main device 4. Detection of the current flowing through the current detection device 1 enables control of the main device 4 even when overcurrent flows through the main device 4.

Patent Document 1: Japanese Laid-Open Patent Application No. H9-293856

Patent Document 2: Japanese Laid-Open Patent Application No. H4-355968

Patent Document 3: Japanese Laid-Open Patent Application No. H6-29539

Patent Document 4: Japanese Laid-Open Patent Application No. 2003-188382

DISCLOSURE OF INVENTION

Problem to be Solved by the Invention

Generally, a main device and a current detection device are fabricated on the same semiconductor substrate according to the same design rule. However, due to differences in design, process variation and so on, the withstand voltage of the current detection device may be lower than the withstand voltage of the main device. In this case, a large reverse bias can trigger avalanche breakdown in the current detection device before in the main device. Gate electric potential under the reverse bias is generally equal to electric potential of the source electrode of the main device. Further, the gate electric potential of the main device is equal to that of the current detection device. Consequently, when avalanche breakdown occurs at the current detection device and avalanche current ($I_a$) flows through a resistor (R) of the current detection device, the difference of potential ($I_a \times R$) between the ends of the resistor is applied to the gate insulator of the current detection device. When the withstand voltage of the gate insulator of the current detection device is less than Ia×R, the current detection device is damaged before the main device by the large reverse bias, whereby current flowing through the main device cannot be monitored.

Further, in the case of an IGBT having a current detection function, the withstand voltage of the current detection device may become lower due to the processing of a diffusion layer disposed peripherally. As a result, when large surge voltage occurs because of, for example, a switching operation of the IGBT, loads and currents build up in the current detection device, which having a low withstand voltage is destroyed, reducing the reliability of the device.

To solve the problems associated with the conventional arts described above, an object of the present invention is to provide a semiconductor device capable of preventing destruction of the current detection device during reverse bias. A further object is to provide a semiconductor device capable of preventing destruction of the current detection device when overcurrent flows.

Means for Solving Problem

To solve the problems described above and achieve an object, a semiconductor device according to an aspect of the invention includes a main device; a current detection device configured to be smaller in size than the main device; and a resistor connected to the main device and the current detection device. Due to difference in potential at the ends of the resistor, the current flowing through the main device is detected. Under reverse bias, withstand voltage of the current detection device is higher than withstand voltage of the main device.

A semiconductor device according to an aspect of the invention includes a main device; a current detection device configured to be smaller in size than the main device; and a resistor connected to both the main device and the current detection device. Due to difference in potential at the ends of the resistor, the current flowing through the main device is detected. The dielectric withstand voltage of gate insulator film is larger than a product of the resistor and maximal current flowing through the current detection device (21) under reverse bias.

A semiconductor device according to an aspect of the invention includes a planar-gate-type main device and a planar-gate-type current detection device, where the resistor is connected between a source electrode (first electrode) of the planar-gate-type main device and a current sensing electrode (third electrode) of the planar-gate-type current detection device, and the diffusion depth of the body region (first semiconductor region of a second conductivity type) is shallower than that of the body region (second semiconductor region of the second conductivity type) of the current detection device.

A semiconductor device according to an aspect of the invention includes a planar-gate-type main device and a planar-gate-type current detection device, where the resistor is connected between a source electrode of the main device and a current sensing electrode of the current detection device, and the curvature of the edge of the body region of the main device is less than that of the body region of the current detection device.

A semiconductor device according to an aspect of the invention includes a planar-gate-type main device and a planar-gate-type current detection device, where the resistor is connected between a source electrode of the main device and a current sensing electrode of the current detection device, and the interval between adjacent body regions of the main device is greater than that between the body regions of the current detection device.

A semiconductor device according to an aspect of the invention includes a trench-gate-type main device and a trench-gate-type current detection device, where the resistor is connected between a source electrode of the main device and a current sensing electrode of the current detection device, and the trench (first trench) of the main device is deeper than the trench (second trench) of the current detection device.

A semiconductor device according to an aspect of the invention includes a trench-gate-type main device and a trench-gate-type current detection device, where the resistor is connected between a source electrode of the main device and a current sensing electrode of the current detection device, and the interval between adjacent trenches of the main device is greater than that between trenches of the current detection device.

A semiconductor device according to an aspect of the invention includes a trench-gate-type main device and a trench-gate-type current detection device, where the resistor is connected between a source electrode of the main device and a current sensing electrode of the current detection device, and the diffusion depth of the body region of the main device is greater than the diffusion depth of the body region of the current detection device.

A semiconductor device according to an aspect of the invention includes a trench-gate-type main device and a trench-gate-type current detection device, where the resistor is connected between a source electrode of the main device and a current sensing electrode of the current detection device, and the impurity density of a region near the interface of the body region of the drift layer (first semiconductor layer of a first conductivity) in the main device is higher than that of a region near the interface of the body region of the drift layer (second semiconductor layer of the first conductivity) in the current detection device.

A semiconductor device according to an aspect of the invention includes a trench-gate-type main device and a trench-gate-type current detection device, where the resistor is connected between a source electrode of the main device and a current sensing electrode of the current detection device, and the width of the trench of the main device is less than that of the trench of the current detection device.

A semiconductor device according to an aspect of the invention includes a trench-gate-type main device and a trench-gate-type current detection device, where the resistor is connected between a source electrode of the main device and a current sensing electrode of the current detection device, and a portion of the body region of the main device, among plural portions divided by the trenches of the main device is floating electrically from the source electrode. Further, the ratio short circuiting the body region of the current detection device by the current sensing electrode is higher than that short circuiting the body region of the main device by the source electrode.

A semiconductor device according to an aspect of the invention is characterized by a collector layer (first semiconductor layer of the second conductivity) being between the drift layer (first semiconductor layer of the first conductivity) of the main device and a drain electrode (second electrode) and a collector layer (second semiconductor layer of the second conductivity) being between the drift layer (second semiconductor layer of the first conductivity) of the current detection device and a drain electrode (fourth electrode).

A semiconductor device according to an aspect of the invention is characterized by the main device and the current detection device being formed on a common semiconductor substrate, in which case, the drift layer of the main device and the drift layer of the current detection device are common and the drain electrode of the main device and the drain electrode of the current detection device are common.

A semiconductor device according to an aspect of the invention is characterized by the main device and the current detection device being formed on a common semiconductor substrate, in which case, the drift layer of the main device and the drift layer of the current detection device are common, the drain electrode of the main device and the drain electrode of the current detection device are common, and the collector layer of the main device and the collector layer of the current detection device are common.

A semiconductor device according to an aspect of the invention is characterized by the main device and the current detection device being formed on different semiconductor substrates, in which case, the drain electrode of the main device and the drain electrode of the current detection device are electrically connected by wire at a peripheral aspect of each chip.

According to an aspect of the invention, under reverse bias, damage to the current detection device is prevented ahead of the main device. According to an aspect of the invention, insulation breakdown at a gate insulator of the current detection device under reverse bias is prevented. According to an aspect of the invention, the semiconductor device of an aspect of the invention is realized. According to an aspect of the invention, the semiconductor device of an aspect of the invention can be realized even by a conductivity modulation type semiconductor device. According to an aspect of the invention, a semiconductor device having a current detection function can be configured by one chip. According to an aspect of the invention, a semiconductor device having a current detection function can be configured by two or more chips.

According to an aspect of the invention, a semiconductor device includes a main active region through which main current flows; a first main electrode; a current detecting structure region that detects fluctuation of the main current flowing through the main active region; a second main electrode that is separated from the first main electrode; and a third main electrode, where the main active region, the first main electrode, the current detecting structure region, and the second main electrode are formed on a first principal aspect of a substrate of a first conductivity type; and the third main electrode is formed on a second principal aspect of the substrate. The main active region includes first trench gate structure units. A first dummy trench structure unit that does not contribute to device control is formed between the first trench gate structure units. The current detecting structure region includes second trench gate structure units. A second dummy trench structure unit that does not contribute to device control is formed between the second trench gate structure units. In the main active region, a first layer that is of a second conductivity type and electrically isolated from the first main electrode is formed between the first trench gate structure unit and the first dummy trench structure unit and between first dummy trench structure units; and the first trench gate structure units are connected to each other. In the current detecting structure region, a second layer that is of the second conductivity type and electrically connected to the second main electrode is formed between the second trench gate structure unit and the second dummy trench structure unit and between the second dummy trench structure units; and the second trench gate structure unit and the first trench gate structure unit are connected to each other.

According to the invention of an aspect of the invention, a semiconductor device includes a main active region through which main current flows; a first main electrode; a current detecting structure region that detects fluctuation of the main current flowing through the main active region; a second main electrode that is separated from the first main electrode; and a third main electrode, where the main active region, the first main electrode, the current detecting structure region, and the second main electrode are formed on a first principal aspect of a substrate of a first conductivity type; and the third main electrode is formed on a second principal aspect of the substrate. The main active region includes first trench gate structure units. A first dummy trench structure unit that does not contribute to device control is formed between the first trench gate structure units. The current detecting structure region includes second trench gate structure units. A second dummy trench structure unit that does not contribute to device control is formed between the second trench gate structure units. In the main active region, a first layer that is of a second conductivity type and electrically isolated from the first main electrode is formed between the first trench gate structure unit and the first dummy trench structure unit and between first dummy trench structure units; and the first trench gate structure units are connected to each other. In the current detecting structure region, a second layer that is of the second conductivity type and electrically isolated from the second main electrode is formed between the second trench gate structure unit and the second dummy trench structure unit and between the second dummy trench structure units; the second trench gate structure unit and the first trench gate structure unit are connected to each other; and the second dummy trench structure unit is electrically connected to the second main electrode.

According to the invention of an aspect of the invention, a semiconductor device includes a main active region through which main current flows; a first main electrode; a current detecting structure region that detects fluctuation of the main current flowing through the main active region; a second main electrode that is separated from the first main electrode; and a third main electrode, where the main active region, the first main electrode, the current detecting structure region, and the second main electrode are formed on a first principal aspect of a substrate of a first conductivity type; and the third main electrode is formed on a second principal aspect of the substrate. The main active region includes first trench gate structure units. A first dummy trench structure unit that does not contribute to device control is formed between the first trench gate structure units. The current detecting structure region includes second trench gate structure units. A second dummy trench structure unit that does not contribute to device control is formed between the second trench gate structure units. In the main active region, a first layer that is of a second conductivity type and electrically isolated from the first main electrode is formed between the first trench gate structure unit and the first dummy trench structure unit and between first dummy trench structure units. The first trench gate structure units are connected to each other; and the first dummy trench structure unit is connected to the first layer of the second conductivity type. In the current detecting structure region, a second layer that is of the second conductivity type and electrically connected to the second main electrode is formed between the second trench gate structure unit and the second dummy trench structure unit and between the second dummy trench structure units; and the second trench gate structure unit and the first trench gate structure unit are connected to each other.

According to an aspect of the invention, a semiconductor device includes a main active region through which main current flows; a first main electrode; a current detecting structure region that detects fluctuation of the main current flowing through the main active region; a second main electrode that is separated from the first main electrode; and a third main electrode, where the main active region, the first main electrode, the current detecting structure region, and the second main electrode are formed on a first principal aspect of a substrate of a first conductivity type; and the third main electrode is formed on a second principal aspect of the substrate. The main active region includes first trench gate structure units. A first dummy trench structure unit that does not contribute to device control is formed between the first trench gate structure units. The current detecting structure region includes second trench gate structure units. A second dummy trench structure unit that does not contribute to device control is formed between the second trench gate structure units. In the main active region, a first layer that is of a second conductivity type and electrically isolated from the first main electrode is formed between the first trench gate structure unit and the first dummy trench structure unit and between first dummy trench structure units; the first trench gate structure units are connected to each other; and the first dummy trench structure unit is connected to the first layer of the second conductivity type. In the current detecting structure region, a second layer that is of the second conductivity type and electrically isolated from the second main electrode is formed between the second trench gate structure unit and the second dummy trench structure unit and between the second dummy trench structure units; the second trench gate structure unit and the first trench gate structure unit are connected to each other; and the second dummy trench structure unit is electrically connected to the second main electrode.

According to an aspect of the invention, a semiconductor device includes a main active region through which main current flows; a first main electrode; a current detecting structure region that detects fluctuation of the main current flowing through the main active region; a second main electrode that is separated from the first main electrode; and a third main electrode, where the main active region, the first main electrode, the current detecting structure region, and the second main electrode are formed on a first principal aspect of a substrate of a first conductivity type; and the third main electrode is formed on a second principal aspect of the substrate. The main active region includes first trench gate structure units. A first dummy trench structure unit that does not contribute to device control is formed between the first trench gate structure units. The current detecting structure region includes second trench gate structure units. A second dummy trench structure unit that does not contribute to device control is formed between the second trench gate structure units. In the main active region, a first layer that is of a second conductivity type and electrically isolated from the first main electrode is formed between the first trench gate structure unit and the first dummy trench structure unit and between first dummy trench structure units; and the first trench gate structure units are connected to each other. In the current detecting structure region, a second layer that is of the second conductivity type and electrically isolated from the second main electrode is formed between the second trench gate structure unit and the second dummy trench structure unit and between the second dummy trench structure units; and the second trench gate structure unit, the second dummy trench structure unit, and the first trench gate structure unit are connected to each other.

According to an aspect of the invention, a semiconductor device includes a main active region through which main current flows; a first main electrode; a current detecting structure region that detects fluctuation of the main current flowing through the main active region; a second main electrode that is separated from the first main electrode; and a third main electrode, where the main active region, the first main electrode, the current detecting structure region, and the second main electrode are formed on a first principal aspect of a substrate of a first conductivity type; and the third main electrode is formed on a second principal aspect of the substrate. The main active region includes first trench gate structure units. A first dummy trench structure unit that does not contribute to device control is formed between the first trench gate structure units. The current detecting structure region includes second trench gate structure units. A second dummy trench structure unit that does not contribute to device control is formed between the second trench gate structure units. In the main active region, a first layer that is of a second conductivity type and electrically isolated from the first main electrode is formed between the first trench gate structure unit and the first dummy trench structure unit and between first dummy trench structure units, the first trench gate structure units being connected to each other; and the first dummy trench structure unit is electrically connected to the first main electrode. In the current detecting structure region, a second layer that is of the second conductivity type and electrically connected to the second main electrode is formed between the second trench gate structure unit and the second dummy trench structure unit and between the second dummy trench structure units; and the second trench gate structure unit and the first trench gate structure unit are connected to each other.

According to an aspect of the invention, a semiconductor device includes a main active region through which main current flows; a first main electrode; a current detecting structure region that detects fluctuation of the main current flowing through the main active region; a second main electrode that is separated from the first main electrode; and a third main electrode, where the main active region, the first main electrode, the current detecting structure region, and the second main electrode are formed on a first principal aspect of a substrate of a first conductivity type; and the third main electrode is formed on a second principal aspect of the substrate. The main active region includes first trench gate structure units. A first dummy trench structure unit that does not contribute to device control is formed between the first trench gate structure units. The current detecting structure region includes second trench gate structure units. A second dummy trench structure unit that does not contribute to device control is formed between the second trench gate structure units. In the main active region, a first layer that is of a second conductivity type and electrically isolated from the first main electrode is formed between the first trench gate structure unit and the first dummy trench structure unit and between first dummy trench structure units; and the first trench gate structure units and the first dummy trench structure unit being connected respectively. In the current detecting structure region, a second layer that is of the second conductivity type and electrically connected to the second main electrode is formed between the second trench gate structure unit and the second dummy trench structure unit and between the second dummy trench structure units; and the second trench gate structure unit and the first trench gate structure unit are connected to each other.

According to an aspect of the invention, a semiconductor device is characterized by the second dummy trench structure unit in the current detecting structure region being connected to the second trench gate structure unit and the first trench gate structure unit.

According to an aspect of the invention, a semiconductor device is characterized by the second dummy trench structure unit in the current detecting structure region being electrically connected to the second main electrode.

According to an aspect of the invention, a semiconductor device includes a main active region through which main current flows; a first main electrode; a current detecting structure region that detects fluctuation of the main current flowing through the main active region; a second main electrode that is separated from the first main electrode; and a third main electrode, where the main active region, the first main electrode, the current detecting structure region, and the second main electrode are formed on a first principal aspect of a substrate of a first conductivity type; and the third main electrode is formed on a second principal aspect of the substrate. The main active region includes first trench gate structure units. The current detecting structure region includes second trench gate structure units. A dummy trench structure unit that does not contribute to device control is formed between the second trench gate structure units. In the main active region, a first layer that is of a second conductivity type and electrically isolated from the first main electrode is formed between the first trench gate structure units; and the first trench gate structure units are connected to each other. In the current detecting structure region, a second layer that is of the second conductivity type and electrically isolated from the second main electrode is formed between the second trench gate structure unit and the second dummy trench structure unit and between the second trench structure units; and the second trench gate structure unit and the first trench gate structure unit are connected to each other.

According to an aspect of the invention, a semiconductor device includes a main active region through which main current flows; a first main electrode; a current detecting structure region that detects fluctuation of the main current flowing through the main active region; a second main electrode that is separated from the first main electrode; and a third main electrode, where the main active region, the first main electrode, the current detecting structure region, and the second main electrode are formed on a first principal aspect of a substrate of a first conductivity type; and the third main electrode is formed on a second principal aspect of the substrate. The main active region includes first trench gate structure units. The current detecting structure region includes second trench gate structure units. A dummy trench structure unit that does not contribute to device control is formed between the second trench gate structure units. In the main active region, a first layer that is of a second conductivity type and electrically isolated from the first main electrode is formed between the first trench gate structure units; and the first trench gate structure units are connected to each other. In the current detecting structure region, a second layer that is of the second conductivity type and electrically connected to the second main electrode is formed between the second trench gate structure unit and the second dummy trench structure unit and between the second trench structure units; and the second trench gate structure unit and the first trench gate structure unit are connected to each other.

According to an aspect of the invention, a semiconductor device is characterized by the dummy trench structure unit in the current detecting structure region being connected to the second trench gate structure unit and the first trench gate structure unit.

According to an aspect of the invention, a semiconductor device is characterized by the dummy trench structure unit in the current detecting structure region being electrically connected to the second main electrode.

According to an aspect of the invention, a semiconductor device is characterized by the dummy trench structure unit in the current detecting structure region being electrically connected to the second layer of the second conductivity.

According to an aspect of the invention, a second conductivity type layer in the main active region takes a floating structure. On the other hand, the potential of a second conductivity type layer in a current detecting structure region is approximately equal to an emitter electrode and thus, does not take a floating structure. Because a device without the floating structure has higher withstand voltage than a device with the floating structure, the current detecting structure region has higher withstand voltage than the main active region. As a result, the build up of load and current due to low withstand voltage does not occur in the current detecting structure region. Therefore, even if overcurrent flows through the main active region, the current detecting structure region is not destroyed and the overcurrent in the main active region can be detected at the current detecting structure region. Operation is stopped or a protection circuit is activated before the main active region is destroyed.

According to an aspect of the invention, a dummy trench structure unit in the main active region is not connected to a gate electrode or emitter electrode, and a dummy trench structure unit in the current detecting structure region is connected to a gate electrode or emitter electrode and has potential identical to the electrodes. Accordingly, the potential of the current detecting structure region becomes stable and thus, the withstand voltage of the current detecting structure region becomes higher than that of the main active region.

According to an aspect of the invention, a dummy trench structure unit is not formed in the main active region but is formed in the current detecting structure region. Accordingly, the withstand voltage of the current detecting structure region becomes higher than that of the main active region.

Effect of the Invention

As set forth above, according to the above embodiments, a current detection device is protected from being destroyed under reverse bias. Insulation breakdown at a gate insulator of the current detection device under reverse bias is prevented.

BRIEF DESCRIPTION OF DRAWINGS

FIG. 34 is a diagram illustrating relationships between a device structure of IGBT and the withstand voltage of the device;

Figure 1:
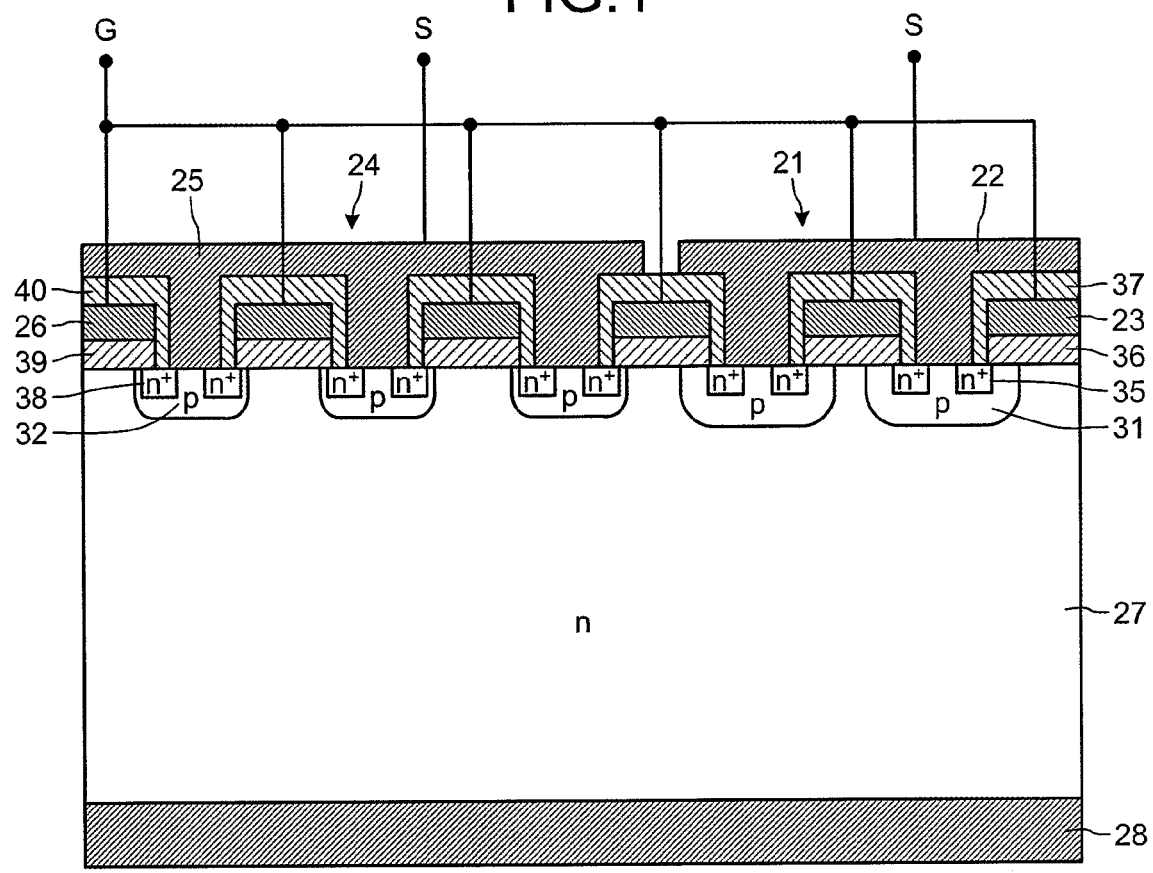
FIG. 1 is a sectional view of a semiconductor device with a current detection function according to a first embodiment.

EXPLANATIONS OF LETTERS OR NUMERALS 10 resistor
21 current detection device
22 current sensing electrode
23, 26 gate electrode
24 main device
25 source electrode
27 n-drift layer
28 drain electrode
31, 32 p-body region
33, 34 trench
35, 38 $n^+$ source region
36, 39 gate insulator
37, 40 interlayer isolator
41 $n^+$ high density region
42 p-collector layer
81, 82 p-type floating layer
83, 84 trench gate electrodes
85, 86 dummy trench electrode

BEST MODE(S) FOR CARRYING OUT THE INVENTION

Referring to the accompanying drawings, exemplary embodiments of a semiconductor device according to the present invention are explained in detail below. In the specification and the accompanying drawings, the names of layers and regions having an "n" or "p" prefix indicate that electrons or holes are a majority carrier. Any region with symbol "+" appended indicates that the region has a higher impurity density than layers or regions without "+". In the explanation of embodiments and the drawings, identical components are given the same respective reference numerals, and redundant explanations are omitted.

First Embodiment

FIG. 1 is a sectional view of a semiconductor device with a current detection function according to a first embodiment. As depicted in FIG. 1, a semiconductor device according to the first embodiment is a planar gate MOSFET. A current detection device 21 is formed on the same semiconductor substrate as a main device 24. An n-drift layer 27 and a drain electrode 28 are shared between the current detection device 21 and the main device 24. The current detection device 21 and the main device 24 are separated by, for example, a p-separation region (not shown). The size of the current detection device 21 is smaller than the size of the main device 24.

A structure of the current detection device 21 is described. A p-body region 31 is selectively deposited in a surface layer of a first principal surface of an n-type semiconductor substrate (the n-drift layer 27). An $n^+$ source region 35 is selectively deposited in a surface layer of the p-body region 31. A gate insulator film 36 contacts a surface of a region of the p-body region 31 between the $n^+$ source region 35 and the n-drift layer 27. A gate electrode 23 is deposited on the gate insulator film 36. The gate electrode 23 is covered by an interlayer insulator 37. A current sensing electrode 22 contacts the $n^+$ source region 35 and the p-body region 31 at a contact hole that opens through the interlayer insulator 37. The drain electrode 28 contacts a second principal surface.

A structure of the main device 24 is described. A p-body region 32 is selectively deposited in a surface layer of a first principal surface of an n-type semiconductor substrate (n-drift layer 27). An $n^+$ source region 38 is selectively deposited in a surface layer of the p-body region 32. A gate insulator film 39 contacts a surface of part of the p-body region 32 between the $n^+$ source region 38 and the n-drift layer 27. A gate electrode 26 is deposited on the gate insulator film 39. The gate electrode 26 is covered by an interlayer insulator 40. A source electrode 25 contacts the $n^+$ source region 38 and the p-body region 32 at a contact hole that opens through the interlayer insulator 40.

A resistor for current detection is placed between and connected with the source electrode 25 and the current sensing electrode 22. The resistor for current detection may be formed on the same semiconductor substrate as the current detection device 21 and the main device 24, or may be an external resistor connected with a semiconductor chip having the current detection device 21 and the main device 24.

For example, patterning of an insulator such as an oxide film covering the first principal surface of the substrate forms the gate insulator film 26 of the current detection device 21 and the gate insulator film 39 of the main device, simultaneously. As a result, the insulators 36 and 39 have substantially the same thickness. The thickness of the insulators 36 and 39 is designed in such a manner that withstand voltage of the gate insulator film 36 is larger than a product of resistance of the resistor for current detection and the maximum current through the current detection device 21 under reverse bias.

Diffusion depth of the p-body region 32 of the main device 24 is designed to be shallower than diffusion depth of the p-body region 31 of the current detection device 21. In this case, curvature of an edge part of the p-body region 32 becomes smaller than curvature of an edge part of the p-body region 31. Consequently, under reverse bias, the electrical field around the edge part of the p-body region 32 becomes stronger than the electrical field around the edge part of the p-body region 31 so that avalanche breakdown tends to occur in the main device 24 before in the current detection device 21, thereby preventing the current detection device 21 from being damaged before the main device 24. In other words, the current detection device 21 has higher withstand voltage than the main device 24 under the reverse bias.

Second Embodiment

Figure 2:
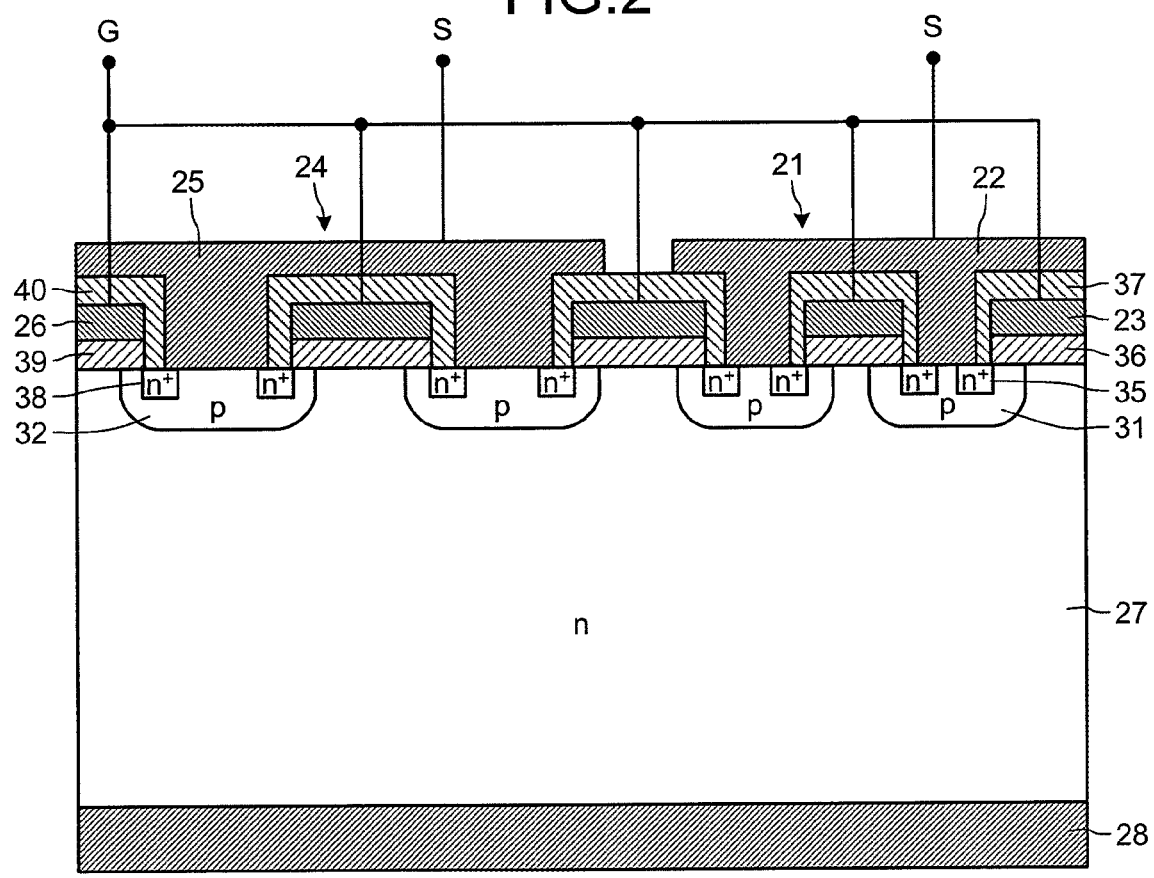
FIG. 2 is a sectional view of a semiconductor device with a current detection function according to a second embodiment.

FIG. 2 is a sectional view of a semiconductor device with a current detection function according to a second embodiment. As depicted in FIG. 2, an interval between adjacent p-body regions 32 of the main device 24 is greater than an interval between adjacent p-body regions 31 of the current detection device 21. Curvature of an edge part and diffusion depth of the p-body regions 31 and 32 are the same. Other details are similar to the first embodiment. Because of the widening of the interval between p-body regions 32 of the main device 24, avalanche breakdown tends to occur in the main device 24 before in the current detection device 21, thereby preventing the current detection device 21 from being damaged before the main device 24. Features of the first and second embodiments may be combined.

Third Embodiment

Figure 3:
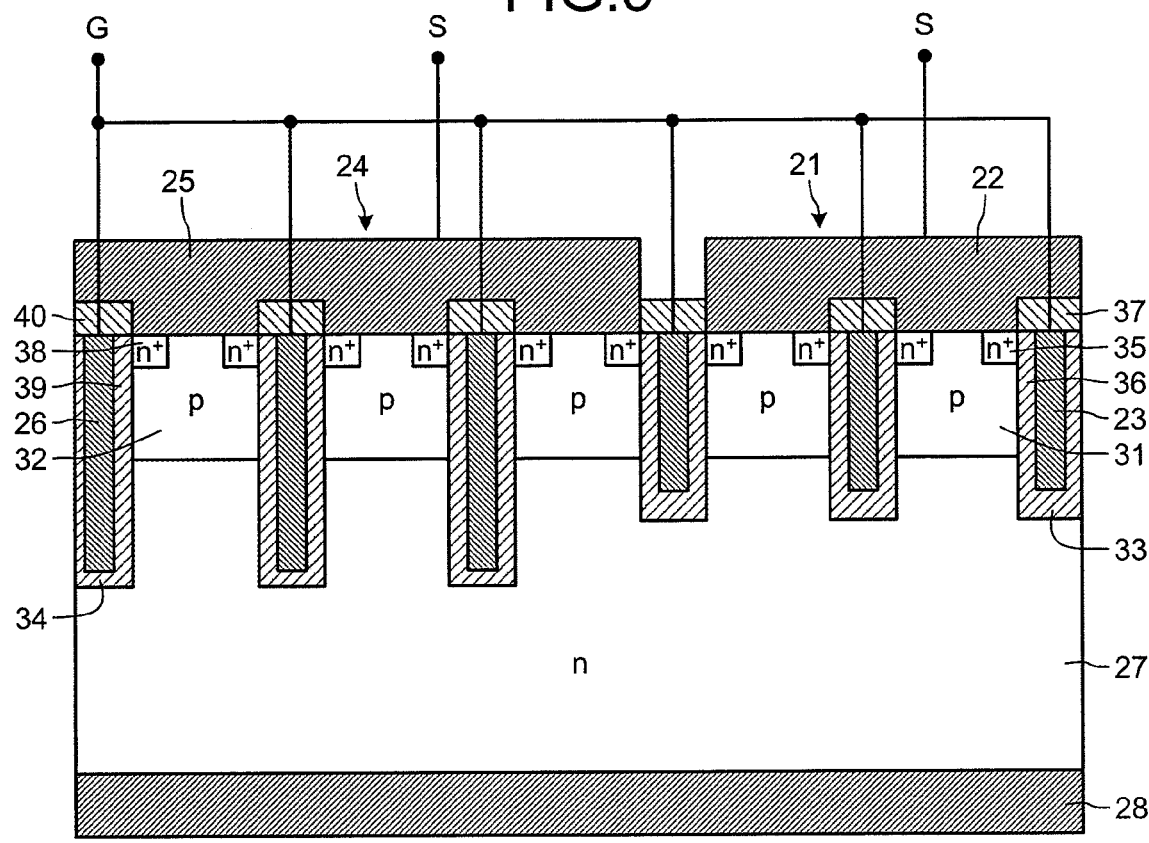
FIG. 3 is a section view of a semiconductor device with a current detection function according to a third embodiment.

FIG. 3 is a section view of a semiconductor device with a current detection function according to a third embodiment. As depicted in FIG. 3, a semiconductor device according to the third embodiment is a trench gate MOSFET. A trench 33 of the current detection device 21 extends through the $n^+$ source region 35 and the p-body region 31 to the n-drift layer 27. The trench 33 is filled with the gate electrode 23 and the gate insulator film 36 enveloping the gate electrode 23. A trench 34 of the main device 24 extends through the $n^+$ source region 38 and the p-body region 32 to the n-drift layer 27. The trench 34 is filled with the gate electrode 26 and the gate insulator film 39 enveloping the gate electrode 26. The trench 34 of the main device 24 is deeper than the trench 33 of the current detection device 21. Other details are similar to the first embodiment. Due to the deeper trench 34 of the main device 24, the withstand voltage of the current detection device 21 becomes higher than the withstand voltage of the main device 24 under reverse bias.

Fourth Embodiment

Figure 4:
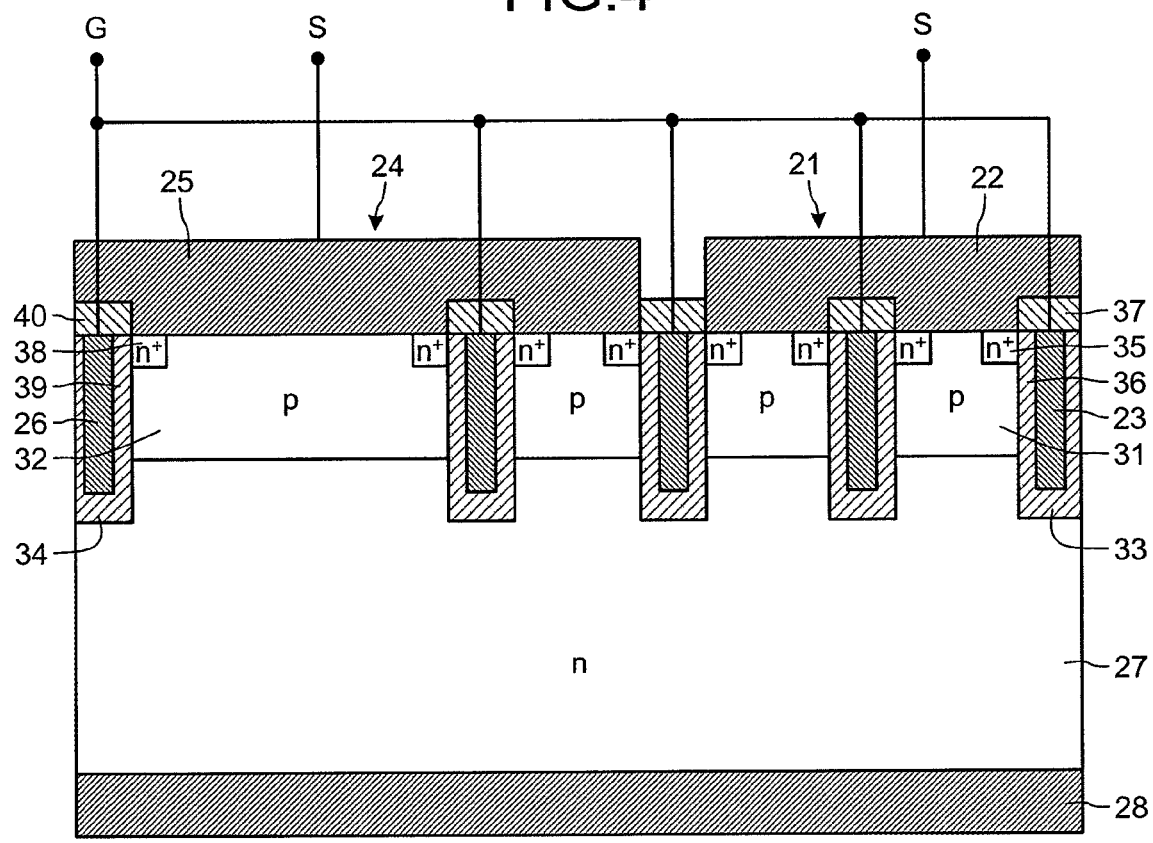
FIG. 4 is a sectional view of a semiconductor device with a current detection function according to a fourth embodiment.

FIG. 4 is a sectional view of a semiconductor device with a current detection function according to a fourth embodiment. As depicted in FIG. 4, an interval between adjacent trenches 34 of the main device 24 is greater than an interval between adjacent trenches 33 of the current detection device 21. Except for the depth of the trench 33 being substantially equal to depth of the trench 34, other details are similar to the third embodiment (this is also applicable to fifth to eighth embodiments). Due to the widening of the interval between the trenches 34 of the main device 24, withstand voltage becomes higher in the current detection device 21 than the main device 24 under reverse bias.

Fifth Embodiment

Figure 5:
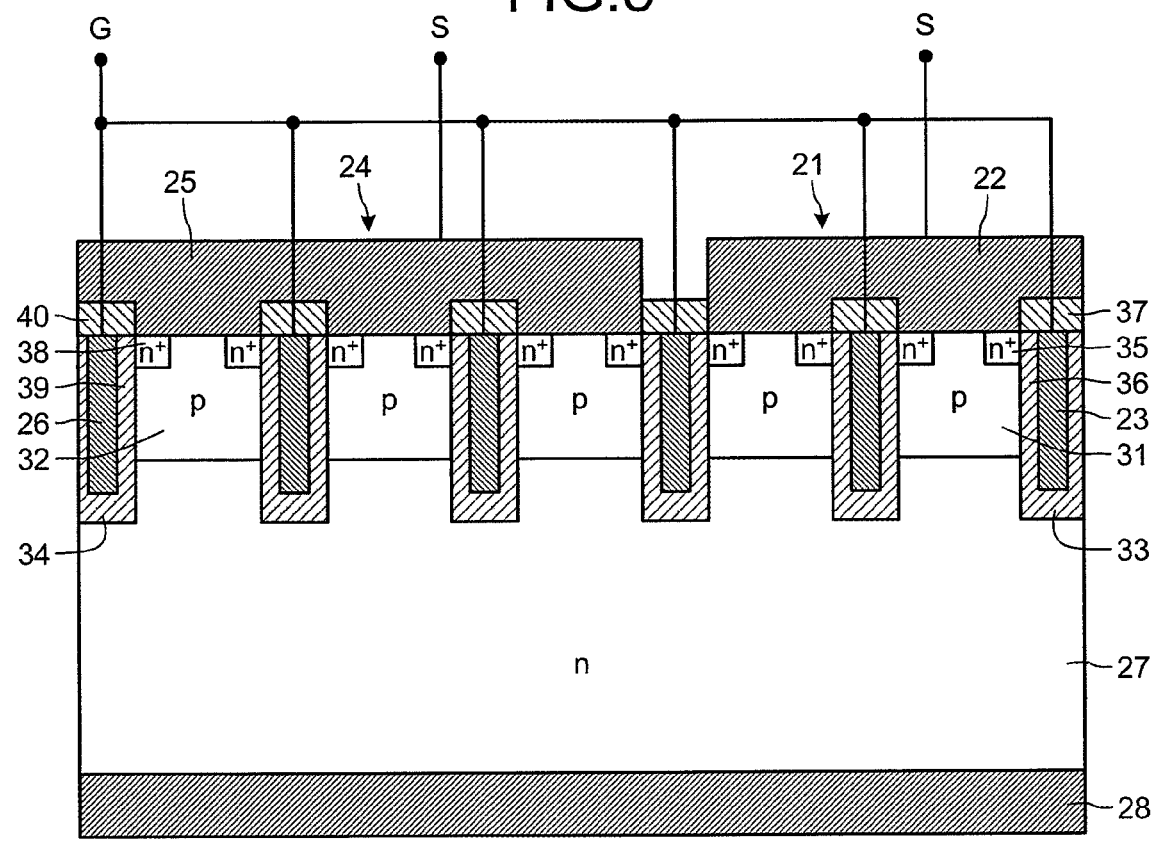
FIG. 5 is a sectional view of a semiconductor device with a current detection function according to a fifth embodiment.

FIG. 5 is a sectional view of a semiconductor device with a current detection function according to a fifth embodiment. As depicted in FIG. 5, the diffusion depth of the p-body region 32 of the main device 24 is shallower than the diffusion depth of the p-body region 31 of the current detection device 21. With this configuration as well, under reverse bias, the withstand voltage of the current detection device 21 becomes higher than the withstand voltage of the main device 24.

Sixth Embodiment

Figure 6:
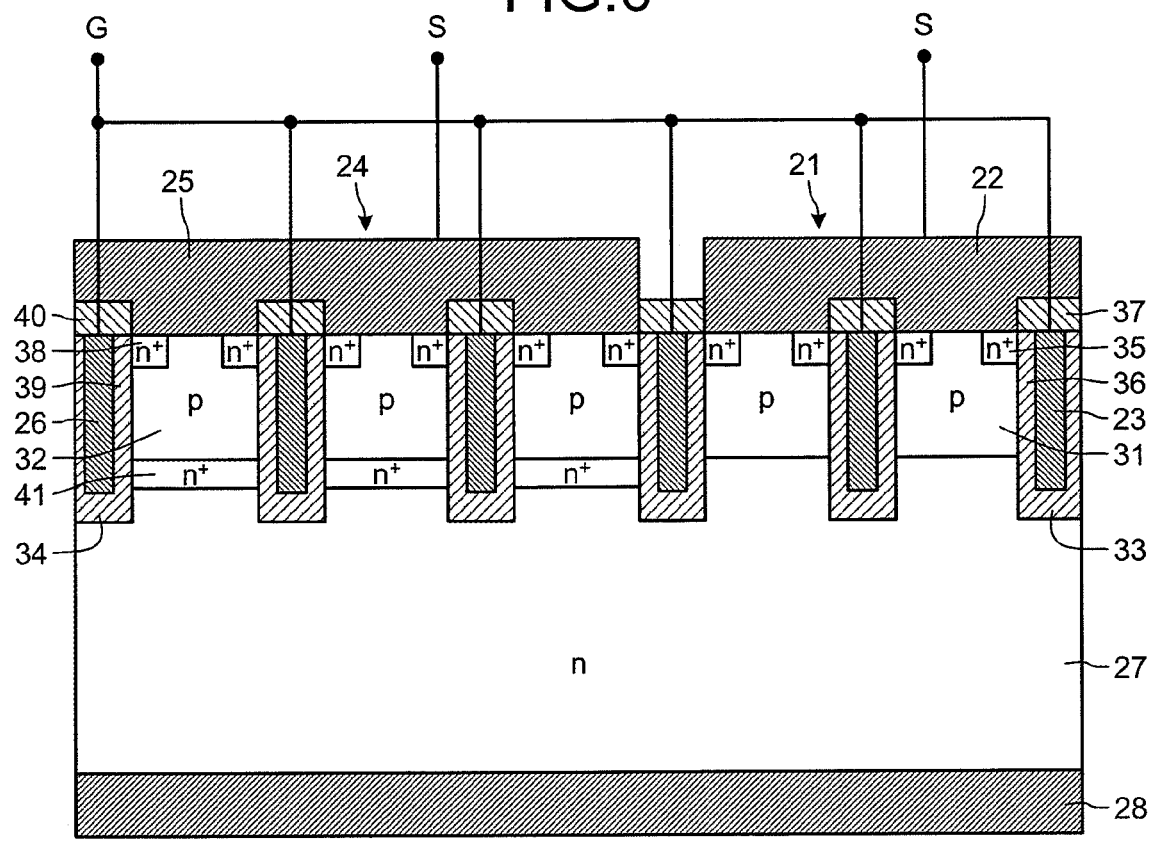
FIG. 6 is a sectional view of a semiconductor device with a current detection function according to a sixth embodiment.

FIG. 6 is a sectional view of a semiconductor device with a current detection function according to a sixth embodiment. As depicted in FIG. 6, in the main device 24, a boundary region between the n-drift layer 27 and the p-body region 32 is occupied by an n+ high density region 41. An n-type impurity density of the n+ high density region 41 is higher than an n-type impurity density of a boundary region between the n-drift layer 27 and the p-body region 31 of the current detection device 21. With this configuration as well, under reverse bias, withstand voltage of the current detection device 21 becomes higher than withstand voltage of the main device 24.

Seventh Embodiment

Figure 7:
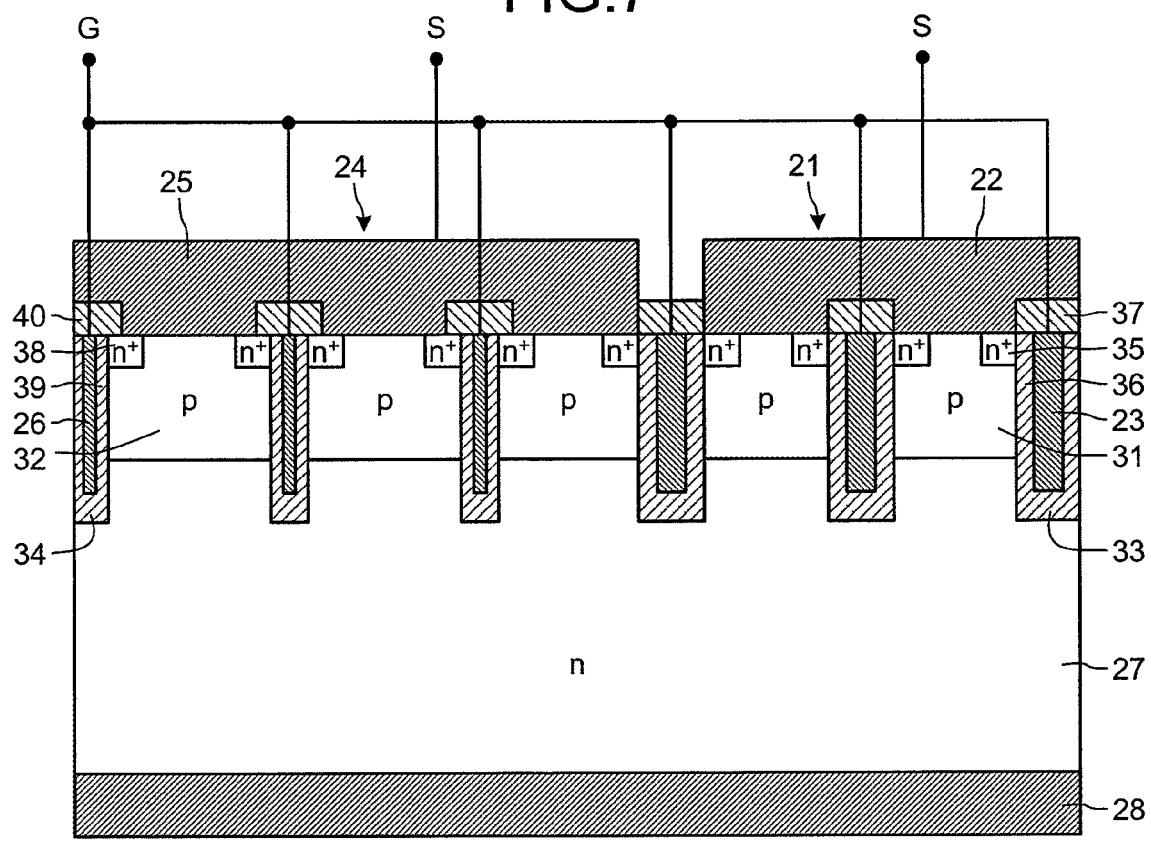
FIG. 7 is a sectional view of a semiconductor device with a current detection function according to a seventh embodiment.

FIG. 7 is a sectional view of a semiconductor device with a current detection function according to a seventh embodiment. As depicted in FIG. 7, the width of the trench 34 of the main device 24 is narrower than the width of the trench 33 of the current detection device 21. With this configuration as well, under reverse bias, the withstand voltage of the current detection device 21 becomes higher than withstand voltage of the main device 24.

Eighth Embodiment

Figure 8:
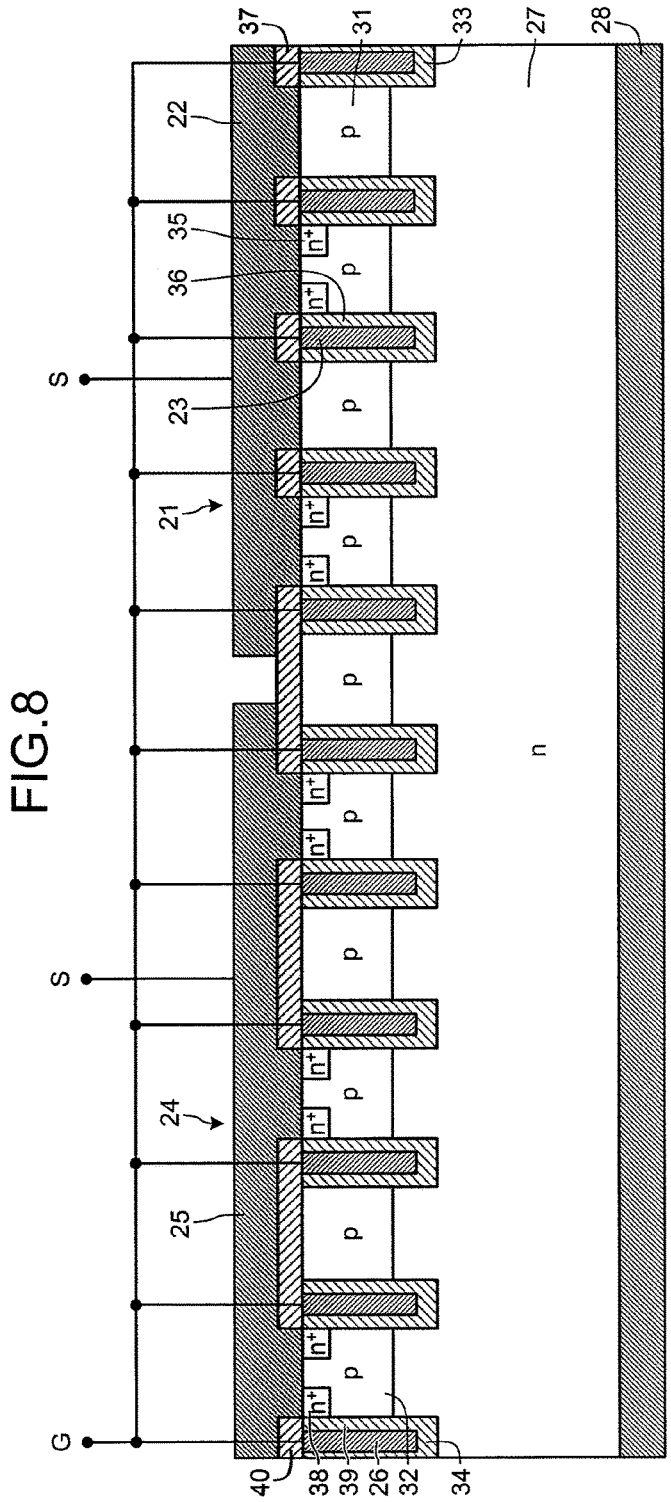
FIG. 8 is a sectional view of a semiconductor device with a current detection function according to an eighth embodiment.

FIG. 8 is a sectional view of a semiconductor device with a current detection function according to an eighth embodiment. As depicted in FIG. 8, in the main device 24, the p-body region 32 is divided into multiple regions by the trenches 34, and some of the regions are covered by the interlayer insulators 40 and are electrically isolated from the source electrode 25. Also in the current detection device 21, though not shown, some of the p-body regions 31 are covered by the interlayer isolator films 37 and are isolated from the current sensing electrode 22. The electrically isolated regions of the p-body regions 31 and 32 do not include the n+ source regions 35 and 38. A ratio of making short circuit between the p-body region 31 and the current sensing electrode 22 is higher than a ratio of making short circuit between the p-body region 32 and the source electrode 25. With this configuration as well, under reverse bias, withstand voltage of the current detection device 21 becomes higher than withstand voltage of the main device 24. Two or more of the third to eighth embodiments may be combined.

Ninth Embodiment

Figure 9:
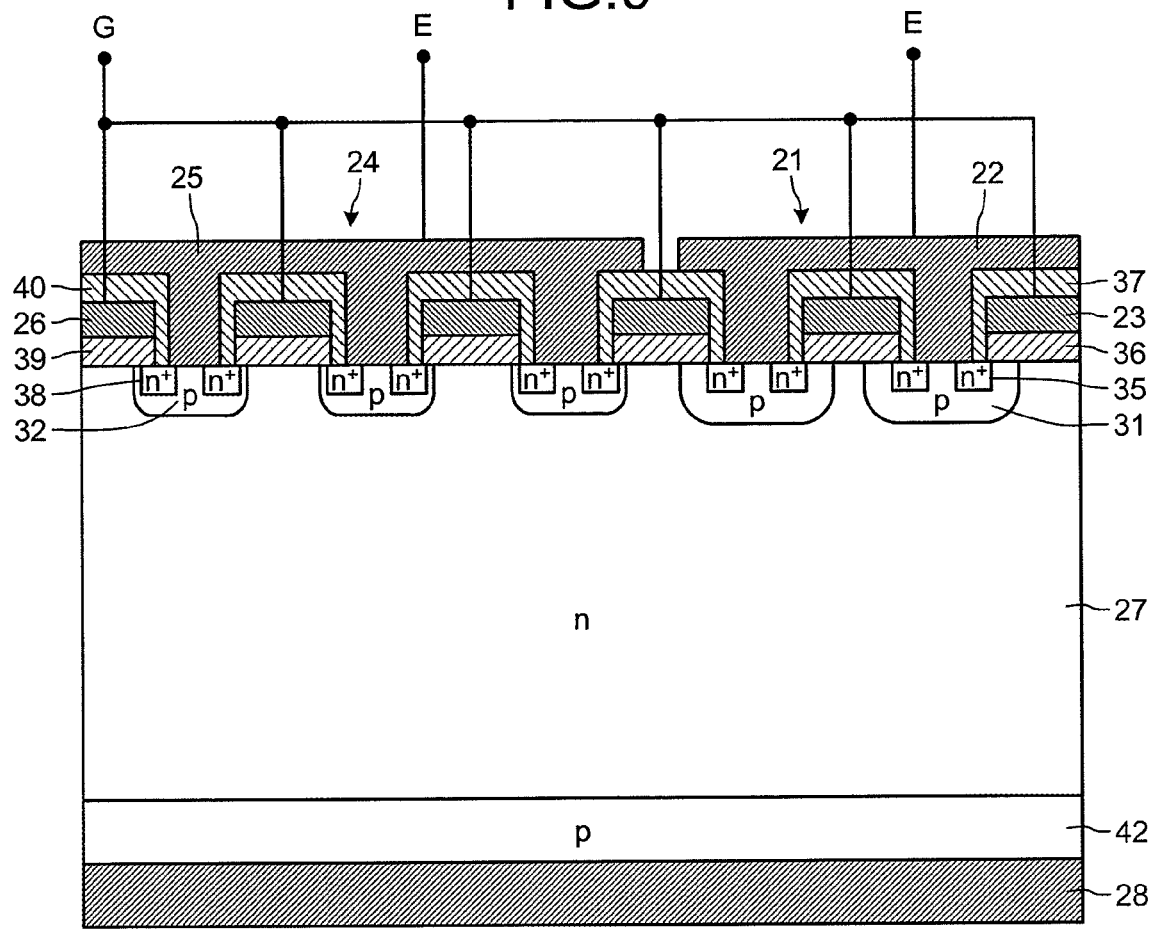
FIG. 9 is a sectional view of a semiconductor device with a current detection function according to a ninth embodiment.

FIG. 9 is a sectional view of a semiconductor device with a current detection function according to a ninth embodiment. As depicted in FIG. 9, a semiconductor device of the ninth embodiment is a planar gate IGBT having a configuration similar to that of the semiconductor device according to the first embodiment and further includes a p-collector layer 42 inserted between the n-drift layer 27 and the drain electrode 28. The p-collector layer 42 is shared between the current detection device 21 and the main device 24. In the IGBT, a p-body region and a drain electrode are called p-base region and collector electrode, respectively. The second to eighth embodiments may have the p-collector layer 42 to yield an IGBT. In this way, even for a conductivity modulation semiconductor device, withstand voltage of the current detection device 21 becomes higher than withstand voltage of the main device 24 under reverse bias.

Tenth Embodiment

Figure 10:
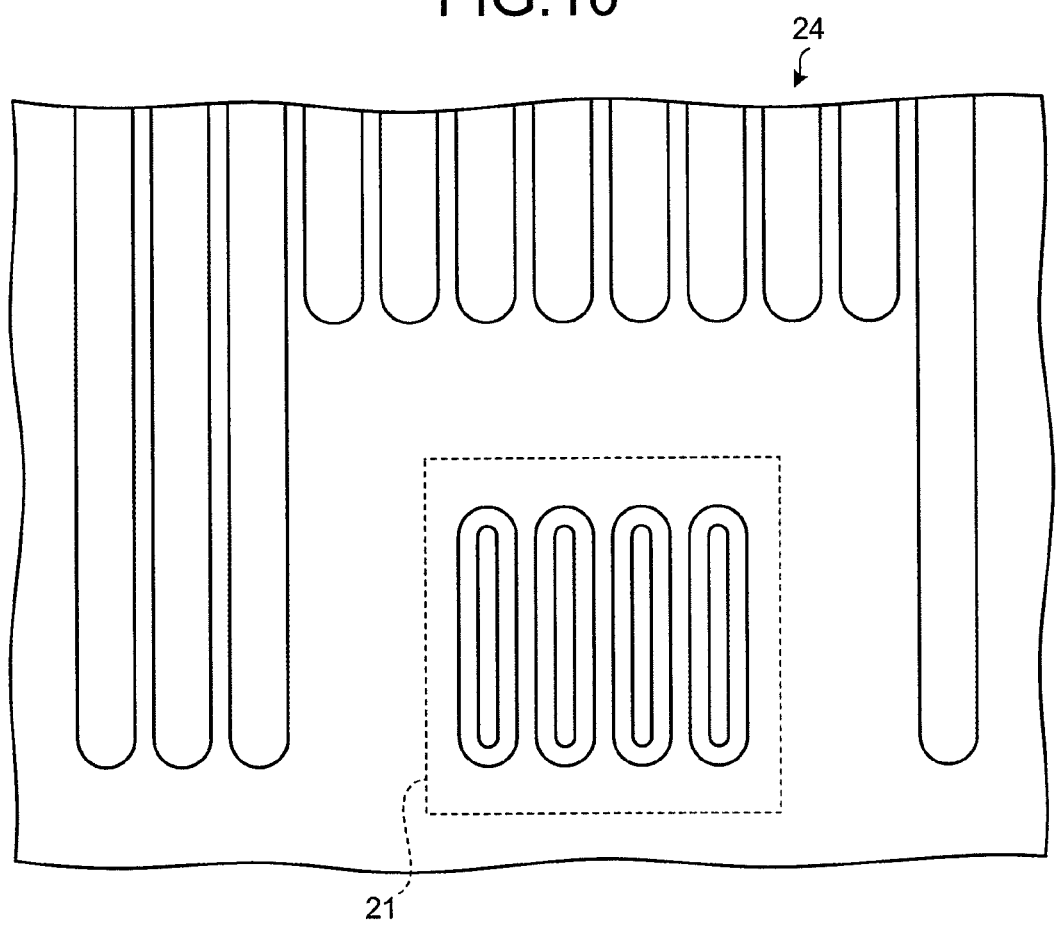
FIG. 10 is a plan view illustrating a configuration of a semiconductor device having a current detection function according to a tenth embodiment.
Figure 11:
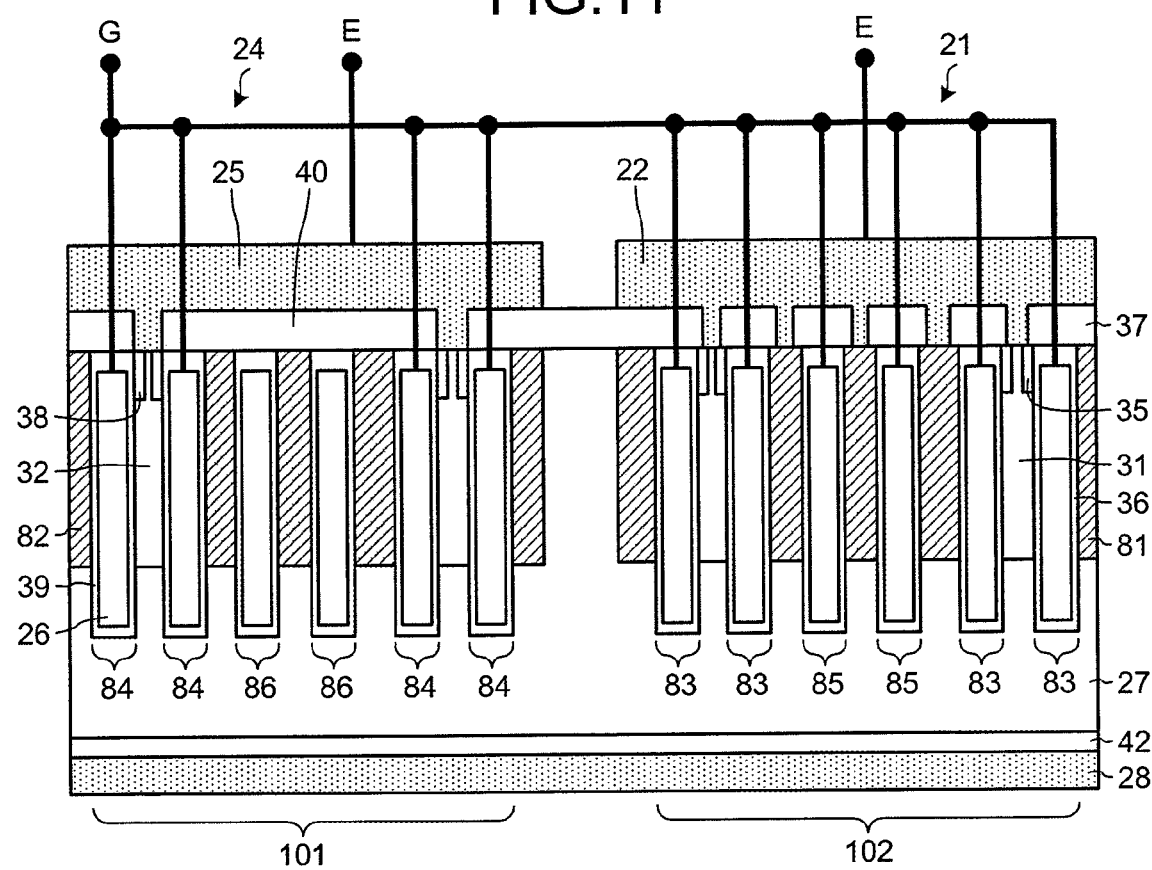
FIG. 11 is a cross-sectional view of the semiconductor device having a current detection function according to the tenth embodiment.

FIG. 10 is a plan view illustrating a configuration of a semiconductor device having a current detection function according to a tenth embodiment. FIG. 11 is a cross-sectional view of the semiconductor device having a current detection function according to the tenth embodiment. As depicted in FIG. 11, the semiconductor device having the current detection function includes a main device 24 and a current detection device 21 separated from the main device 24. The current detection device 21 is formed in a current detecting structure region of the same substrate as the main device 24. Therefore, the current detection device 21 and the main device 24 share an n-drift layer 27, a p-collector layer 42, and a collector electrode 28.

In FIG. 11, the main device 24 and the current detection device 21 are about the same size. However, actually, the surface area of the current detection device 21 is several tenths smaller than that of the main device 24. Therefore, reflecting the ratio of the surface areas, the current that flows through the current detection device 21 is several percent of that flowing through the main device 24. Detection of the current flowing through the current detection device 21 enables control of the main device 24 even when overcurrent flows through the main device 24.

The structure of the main device 24 is explained. The main device 24 is formed in the main active region on the same semiconductor substrate as the current detection device 21 and has a first dummy trench IGBT structure 101. Multiple trenches are formed on a surface opposite to a surface where a collector electrode 28 of an n-drift layer 27 is formed. In the trenches, trench gate electrodes 84 and dummy trench electrodes 86 are formed where gate electrodes 26, electrodes made of polycrystalline silicone or the like, are implanted with a gate insulating film flanked by a trench and an electrode. The trench gate electrode 84 is made up of a trench gate structure unit that is electrically connected to a gate terminal G. The dummy trench electrode 86 is made up of a dummy trench structure unit that is not connected to the gate terminal G.

On the surface of a region between the trench gate electrodes 84, a p-base region 32 is formed. In the p-base region 32, n+ source regions 38 are formed on the trench gate electrodes 84. On the entire substrate, interlayer insulator 40 is formed. The interlayer insulator includes an opening through which the p-base region 32 and the n+ source regions 38 contact an emitter electrode 25. In regions between the trench gate electrode 84 and the dummy trench electrode 86 and between the dummy trench electrodes 86, a p-type floating layer 82 is formed. The p-type floating layer 82 is separated from the emitter electrode 25 by the interlayer insulator 40 and is electrically isolated (floating) from the emitter electrode 25. The trench gate electrodes 84 of the main device 24 are electrically connected to each other and are connected to the gate terminal G. The dummy trench electrodes 86 are connected to the p-type floating layer 82 in a region that is not depicted in the drawing. In this way, potential of the main device 24 becomes stable.

The structure of the current detection device 21 is explained. The current detection device 21 has a second dummy trench IGBT structure 102. Namely, the current detection device 21 is different from the main device 24 in that a p-type floating layer 81 contacts a current sensing electrode (emitter electrode) 22. Therefore, potential of the p-type floating layer 81 becomes identical to that of the emitter electrode 22 and is not electrically isolated from the emitter electrode 22.

The dummy trench electrode 85 is electrically connected to the trench gate electrode 83 of the current detection device 21 and the trench gate electrode 84 of the main device 24. Accordingly, potential of the dummy trench electrodes 85 becomes identical to the gate terminal G. The emitter electrode 22 is separated from the emitter electrode 25 of the main device 24. As depicted in FIG. 10, each trench may be terminated in the main device 24 and the current detection device 21.

According to the tenth embodiment, as the withstand voltage of the main device 24 and the current detection device 21 becomes higher, loads or currents do not build up in the current detection device 21 even if large surge voltage is caused by, for example, the switching operation of the IGBT. Therefore, even when overcurrent flows through the main device 24, the current detection device 21 is not destroyed and the current detection device 21 can detect the overcurrent flowing through the main device 24. As a result, operation can be stopped or a protection circuit is activated before the main device 24 is destroyed, whereby reliability of a device is improved.

Eleventh Embodiment

Figure 12:
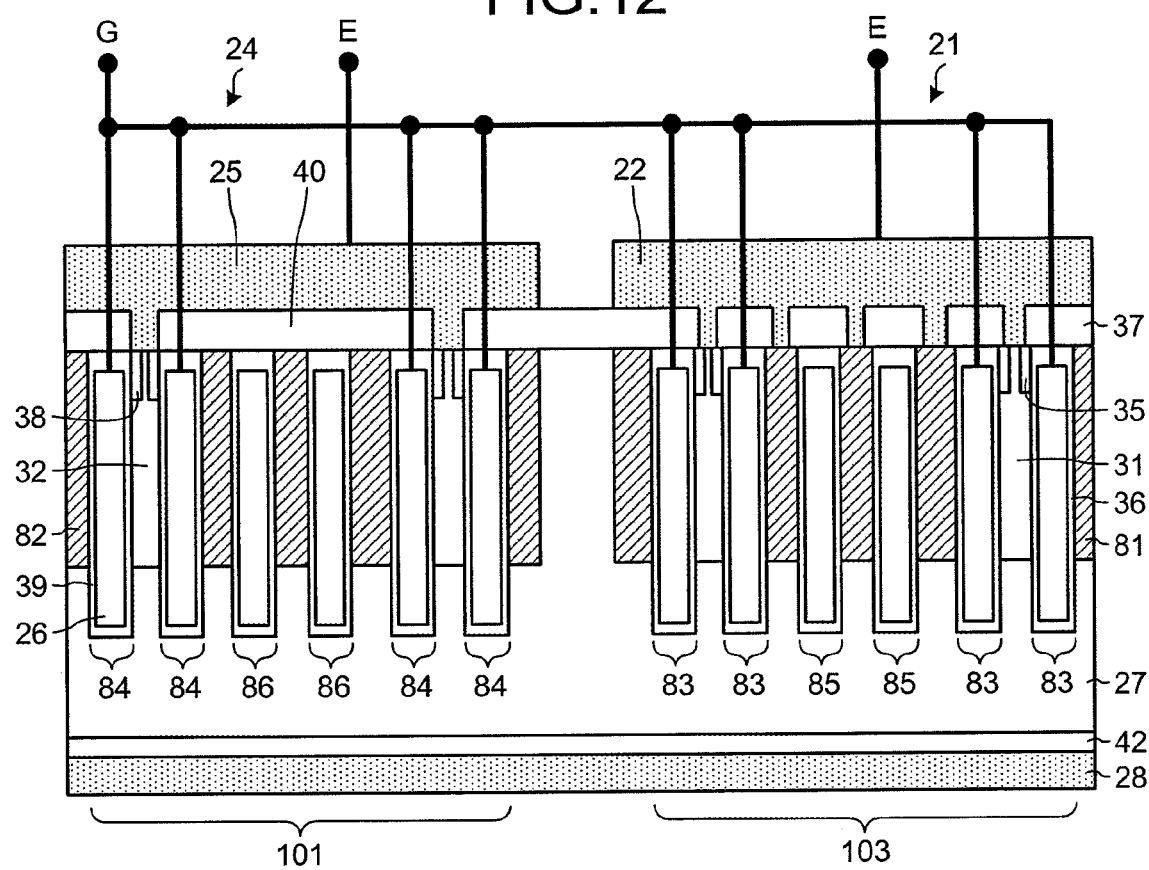
FIG. 12 is a cross-sectional view of a semiconductor device having a current detection function according to an eleventh embodiment.

FIG. 12 is a cross-sectional view of a semiconductor device having a current detection function according to an eleventh embodiment. As depicted in FIG. 12, according to the eleventh embodiment, the current detection device 21 has a third dummy trench IGBT structure 103 compared with the tenth embodiment. In the current detection device 21, the dummy trench electrodes 85 are not connected to the trench gate electrodes 83 and 84 but are connected to the p-type floating layer 81 in a region that is not depicted in the drawing. As a result, potential of the current detection device 21 becomes stable. The p-type floating layer 81 is also connected to the emitter electrode. Accordingly, potential of the p-type floating layer 81 becomes identical to potential of the emitter electrode 22, the p-type floating layer 81 not being electrically isolated from the emitter electrode 22. In this way, the withstand voltage of the current detection device 21 becomes higher than the main device 24.

Twelfth Embodiment

Figure 13:
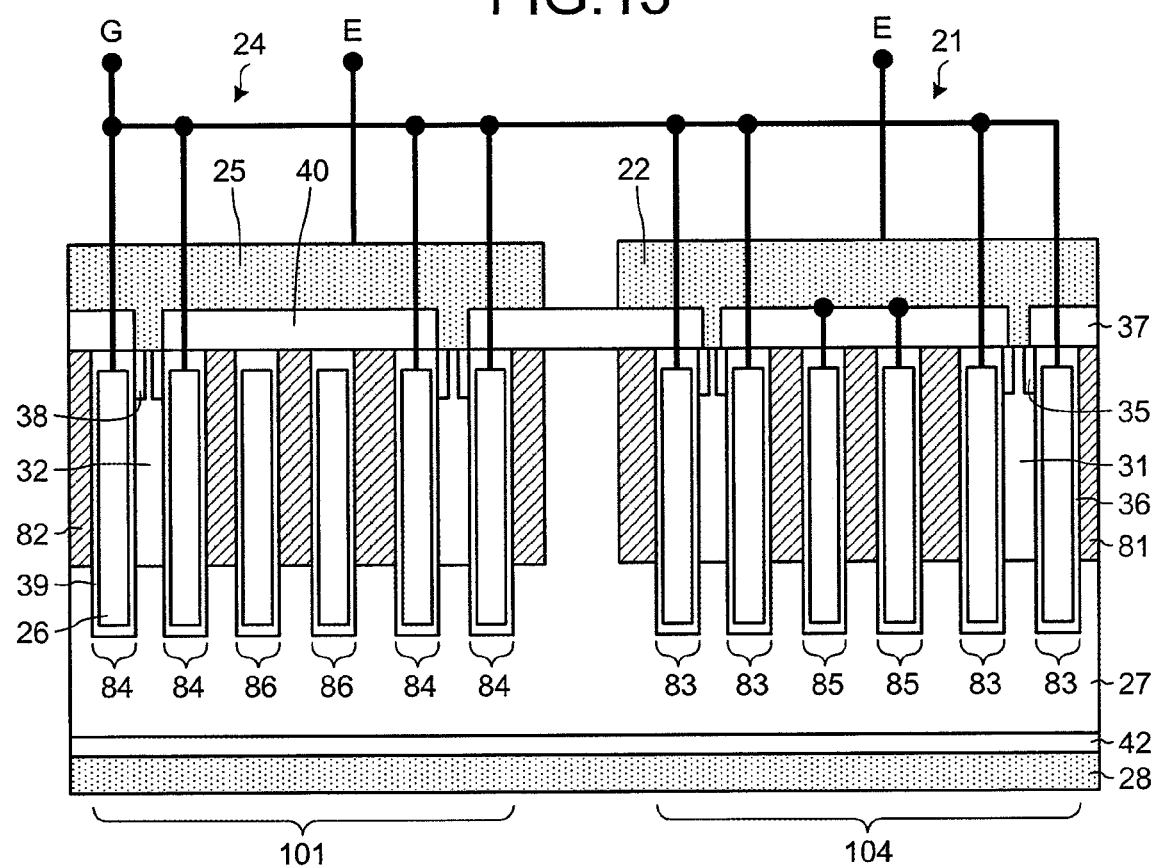
FIG. 13 is a cross-sectional view illustrating a semiconductor device having a current detection function according to a twelfth embodiment.

FIG. 13 is a cross-sectional view illustrating a semiconductor device having a current detection function according to a twelfth embodiment. In the twelfth embodiment, the current detection device 21 has a fourth dummy trench IGBT structure 104 compared with the tenth embodiment and the eleventh embodiment. In the current detection device 21, the dummy trench electrodes 85 are electrically connected to the emitter electrode 22. Therefore, the dummy trench electrodes 85 and the emitter electrode 22 have identical potential and thus, potential of the current detection device 21 becomes stable. The p-type floating layers 81 are separated from the emitter electrode 22 by the interlayer insulator 37. Thus, the p-type floating layers 81 are electrically isolated (floating) from the emitter electrode 22. In this way, the withstand voltage of the current detection device 21 becomes higher than the main device 24.

Thirteenth Embodiment

Figure 14:
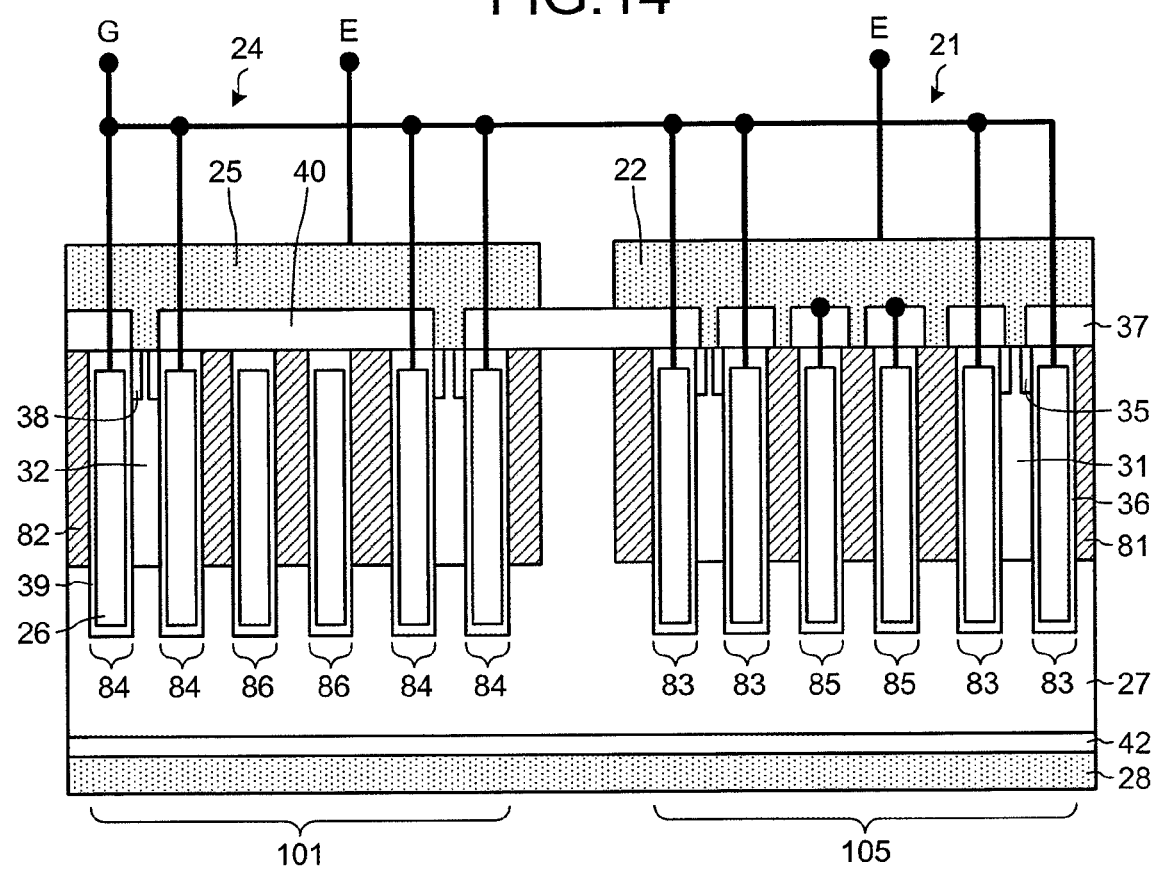
FIG. 14 is a cross-sectional view of a semiconductor device having a current detection function according to a thirteenth embodiment.

FIG. 14 is a cross-sectional view of a semiconductor device having a current detection function according to a thirteenth embodiment. As depicted in FIG. 14, according to the thirteenth embodiment, the current detection device 21 has a fifth dummy trench IGBT structure 105 compared with the tenth to twelfth embodiments. In the current detection device 21, the dummy trench electrodes 85 are electrically connected to the emitter electrode 22. Accordingly, potential of the dummy trench electrodes 85 and the emitter electrode 22 becomes identical and thus, potential of the current detection device 21 becomes stable. The p-type floating layers 81 contact the emitter electrode 22. Thus potential of the p-type floating layers 81 and the emitter electrode 22 becomes identical and the p-type floating layers 81 are not electrically isolated from the emitter electrode 22. In this way, the withstand voltage of the current detection device 21 becomes higher than the main device 24.

Fourteenth Embodiment

Figure 15:
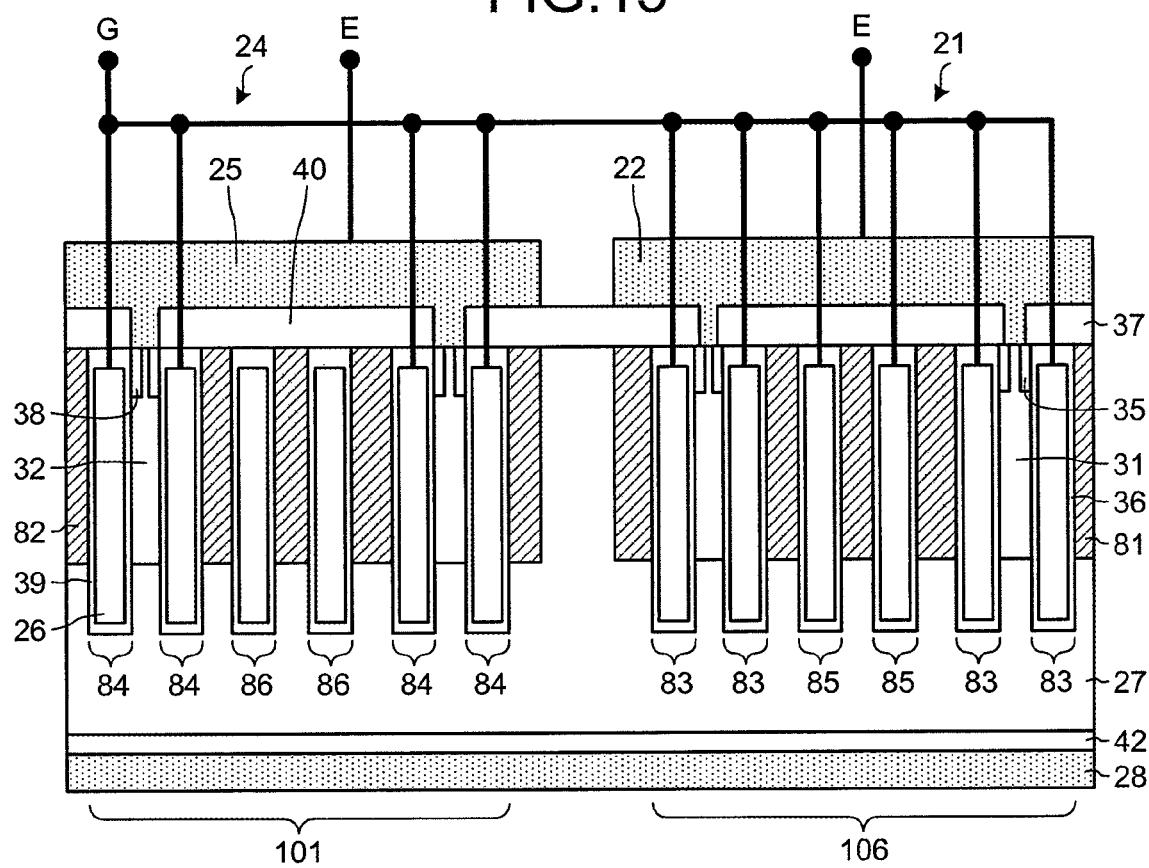
FIG. 15 is a cross-sectional view illustrating a semiconductor device having a current detection function according to a fourteenth embodiment.

FIG. 15 is a cross-sectional view illustrating a semiconductor device having a current detection function according to a fourteenth embodiment. As depicted in FIG. 15, according to the fourteenth embodiment, the current detection device 21 has a sixth dummy trench IGBT structure 106 compared with the tenth to thirteenth embodiments. In the current detection device 21, the dummy trench electrodes 85 are electrically connected to the trench electrodes 83 and 84. As a result, the dummy trench electrodes 85 and the gate terminal G have identical potential. The p-type floating layers 81 are separated from the emitter electrode 22 by the interlayer insulator 37 and thus, are electrically isolated (floating) from the emitter electrode 22. In this way, the withstand voltage of the current detection device 21 becomes higher than the main device 24.

Fifteenth Embodiment

Figure 16:
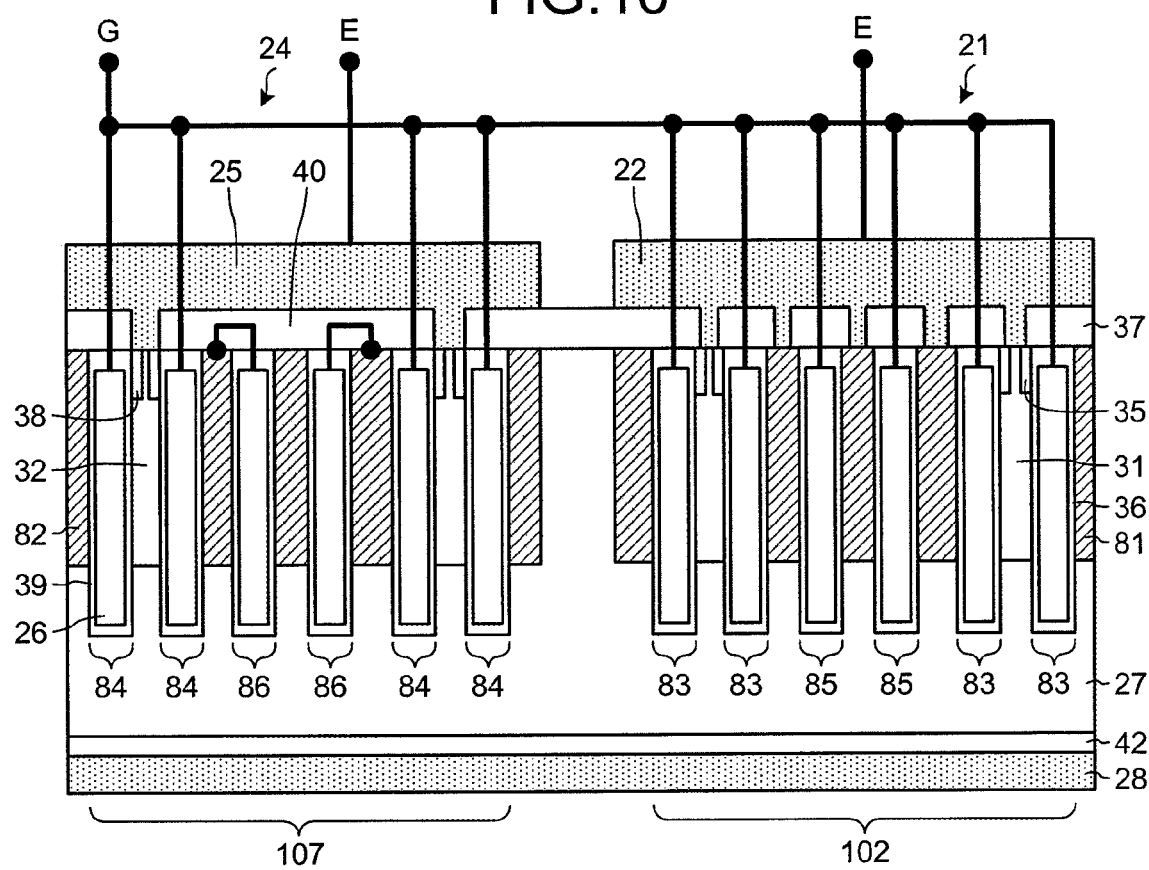
FIG. 16 is a cross-sectional view illustrating a semiconductor device having a current detection function according to a fifteenth embodiment.

FIG. 16 is a cross-sectional view illustrating a semiconductor device having a current detection function according to a fifteenth embodiment. As depicted in FIG. 16, in the fifteenth embodiment, the main device 24 has a seventh dummy trench IGBT structure 107 compared with the tenth embodiment. In the main device 24, a dummy trench electrode 86 is connected to a p-type floating layer 82. It is desirable for the dummy trench electrode 86 to be connected to a p-type floating layer 82 closer to an $n^+$ source region 38 because the withstand voltage rises more. The p-type floating layer 82 is separated from the emitter electrode 25 by the interlayer insulator 40 and is connected to the dummy trench electrode 86. In this way, the withstand voltage of the current detection device 21 becomes higher than the main device 24.

Sixteenth Embodiment

Figure 17:
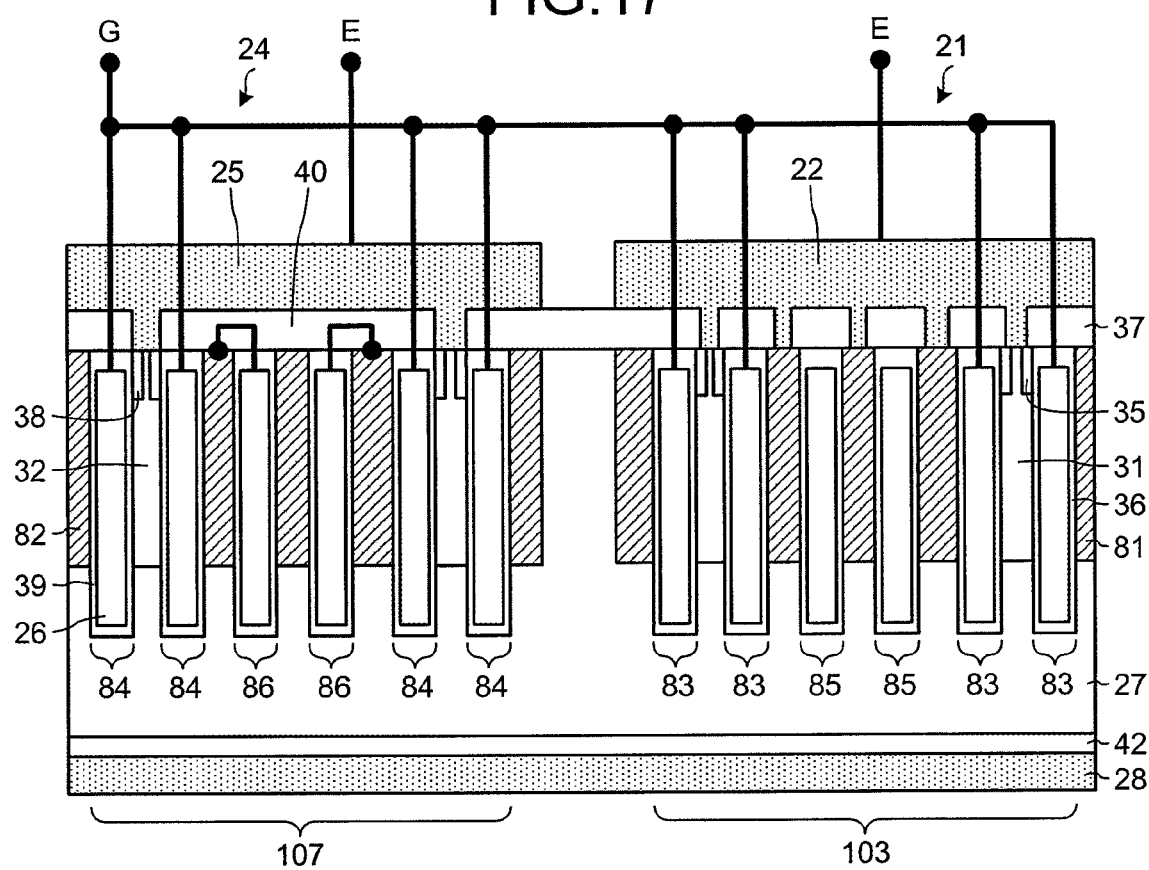
FIG. 17 is a cross-sectional view illustrating a semiconductor device having a current detection function according to a sixteenth embodiment.

FIG. 17 is a cross-sectional view illustrating a semiconductor device having a current detection function according to a sixteenth embodiment. As depicted in FIG. 17, in the sixteenth embodiment, the current detection device 21 has the third dummy trench IGBT structure 103 compared with the fifteenth embodiment. In this way, the withstand voltage of the current detection device 21 becomes higher than the main device 24.

Seventeenth Embodiment

Figure 18:
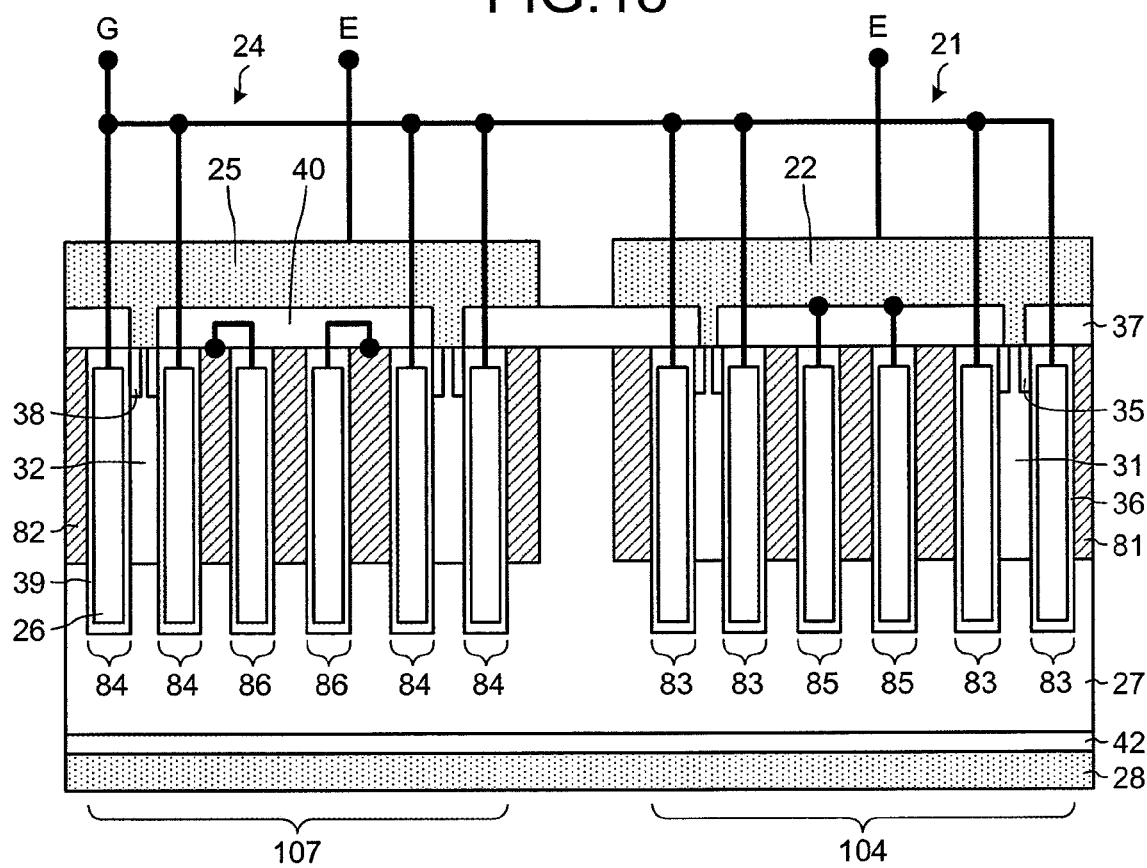
FIG. 18 is a cross-sectional view illustrating a semiconductor device having a current detection function according to the seventeenth embodiment.

FIG. 18 is a cross-sectional view illustrating a semiconductor device having a current detection function according to the seventeenth embodiment. As depicted in FIG. 18, in the seventeenth embodiment, the current detection device 21 has the fourth dummy trench IGBT structure 104 compared with the fifteenth and sixteenth embodiments. In this way, the withstand voltage of the current detection device 21 becomes higher than the main device 24.

Eighteenth Embodiment

Figure 19:
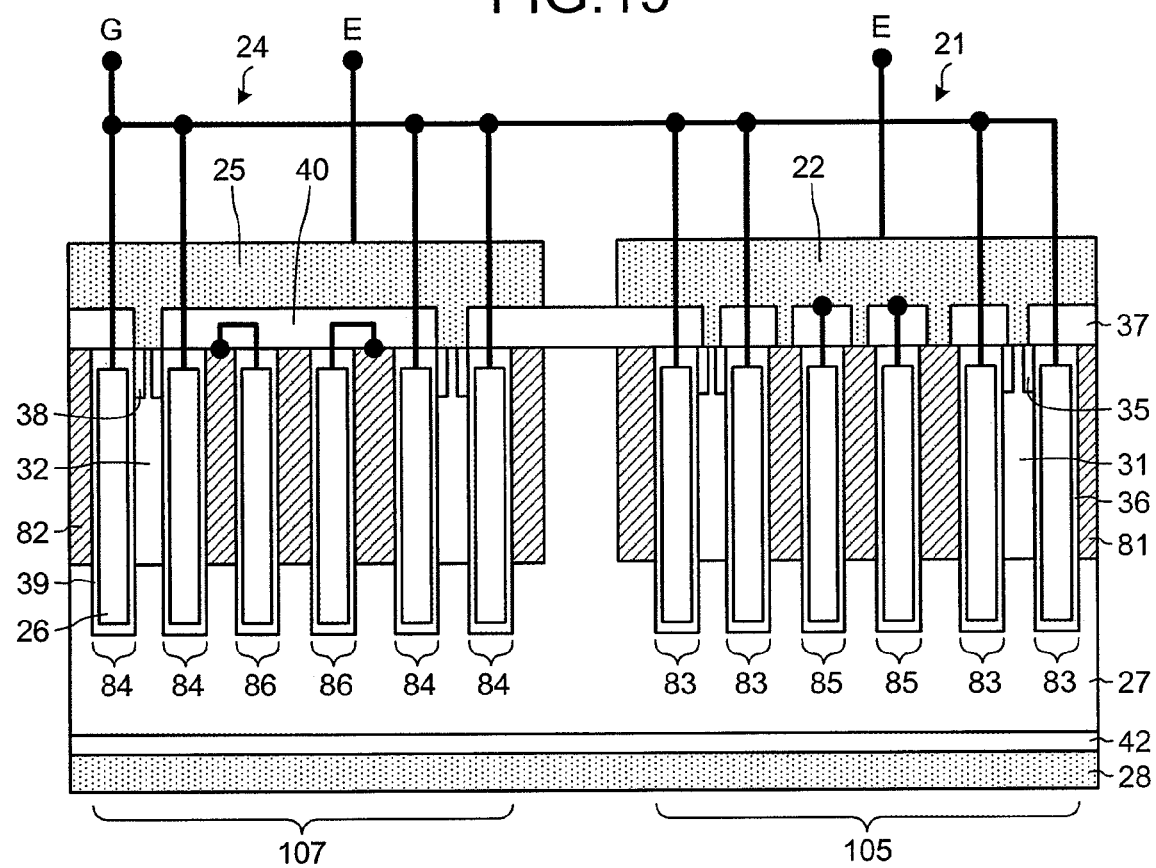
FIG. 19 is a cross-sectional view illustrating a semiconductor device having a current detection function according to an eighteenth embodiment.

FIG. 19 is a cross-sectional view illustrating a semiconductor device having a current detection function according to an eighteenth embodiment. As depicted in FIG. 19, in the eighteenth embodiment, the current detection device 21 has the fifth dummy trench IGBT structure 105 compared with the fifteenth to seventeen embodiments. In this way, the withstand voltage of the current detection device 21 becomes higher than the main device 24.

Nineteenth Embodiment

Figure 20:
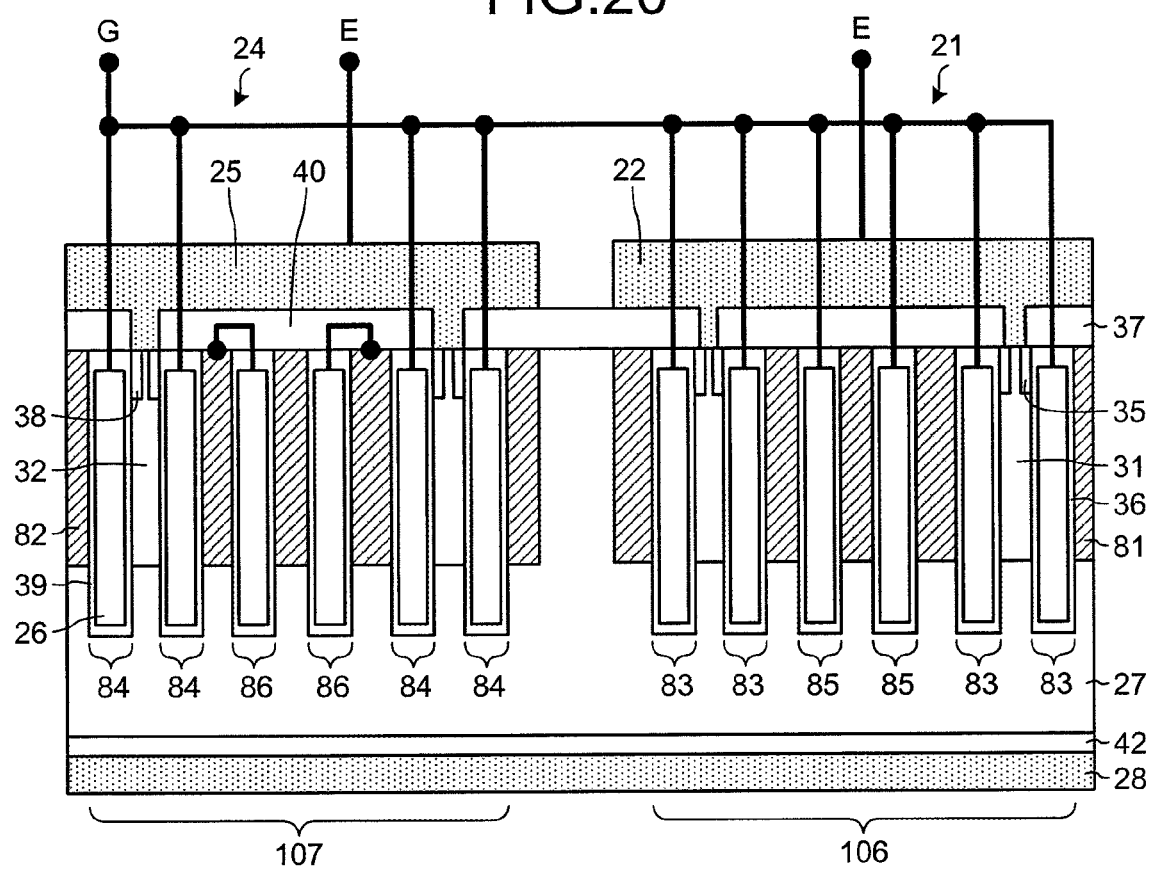
FIG. 20 is a cross-sectional view illustrating a semiconductor device having a current detection function according to a nineteenth embodiment.

FIG. 20 is a cross-sectional view illustrating a semiconductor device having a current detection function according to a nineteenth embodiment. As depicted in FIG. 20, in the nineteenth embodiment, the current detection device 21 has the sixth dummy trench IGBT structure 106 compared with the fifteenth to eighteenth embodiments.

Twentieth Embodiment

Figure 21:
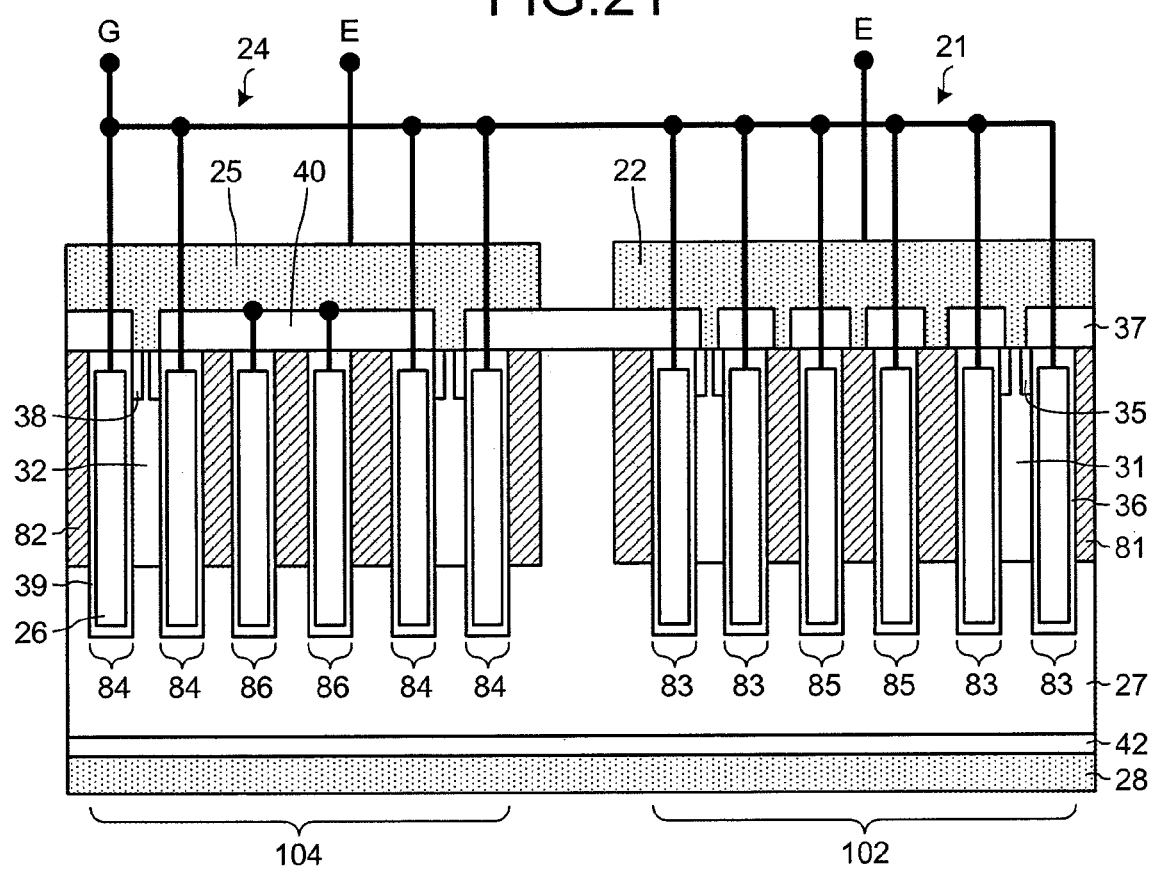
FIG. 21 is a cross-sectional view illustrating a semiconductor device having a current detection function according to a twentieth embodiment.

FIG. 21 is a cross-sectional view illustrating a semiconductor device having a current detection function according to a twentieth embodiment. As depicted in FIG. 21, in the twentieth embodiment, the main device 24 has the fourth dummy trench IGBT structure 104 compared with the tenth embodiment. A dummy trench electrode 86 of the main device 24 is electrically connected to the emitter electrode 25. As a result, potential of the main device 24 becomes stable. A p-type floating layer 82 is separated from the emitter electrode 25 by the interlayer insulator 40. Therefore, the p-type floating layer 82 is electrically isolated (floating) from the emitter electrode 25. In this way, the withstand voltage of the current detection device 21 becomes higher than the main device 24.

Twenty-First Embodiment

Figure 22:
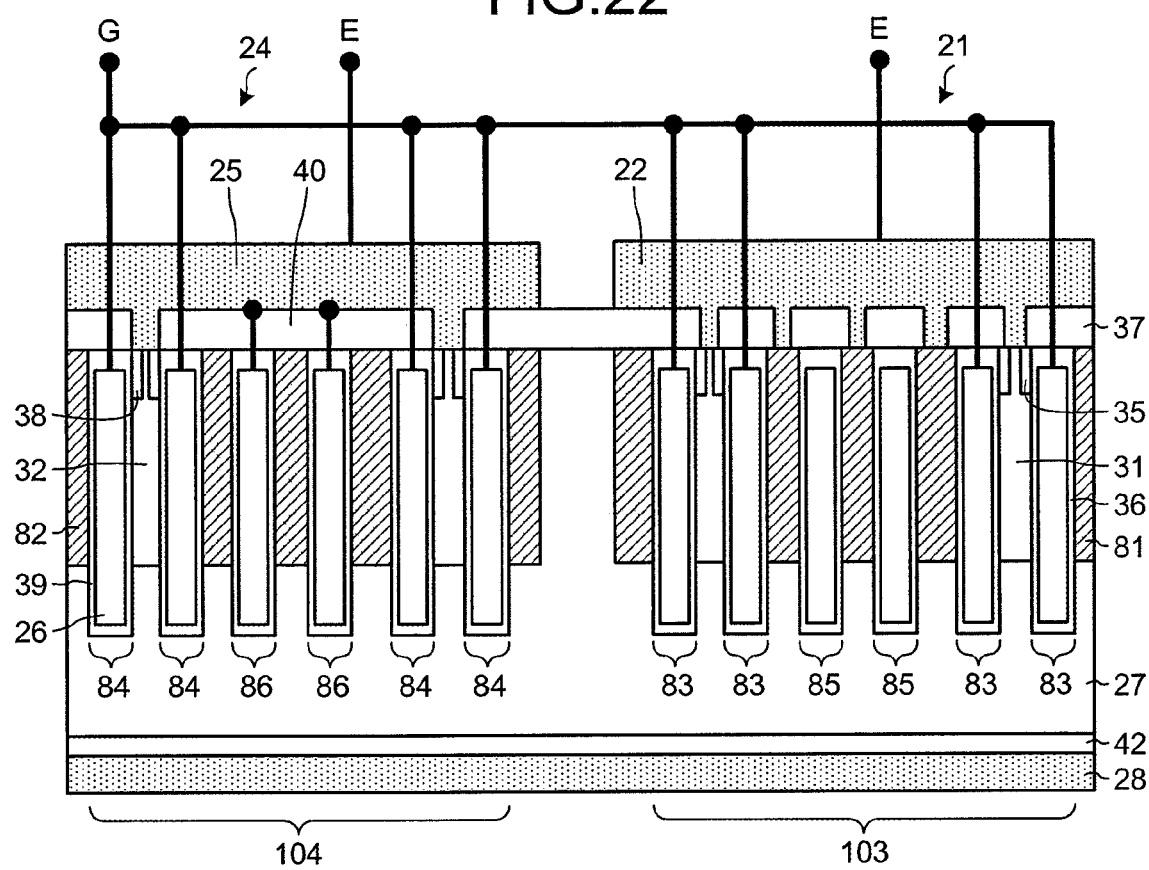
FIG. 22 is a cross-sectional view illustrating a semiconductor device having a current detection function according to a twenty-first embodiment.

FIG. 22 is a cross-sectional view illustrating a semiconductor device having a current detection function according to a twenty-first embodiment. As depicted in FIG. 22, in the twenty-first embodiment, the current detection device 21 has a third dummy trench IGBT structure 103 compared with the twentieth embodiment. In this way, the withstand voltage of the current detection device 21 becomes higher than the main device 24.

Twenty-Second Embodiment

Figure 23:
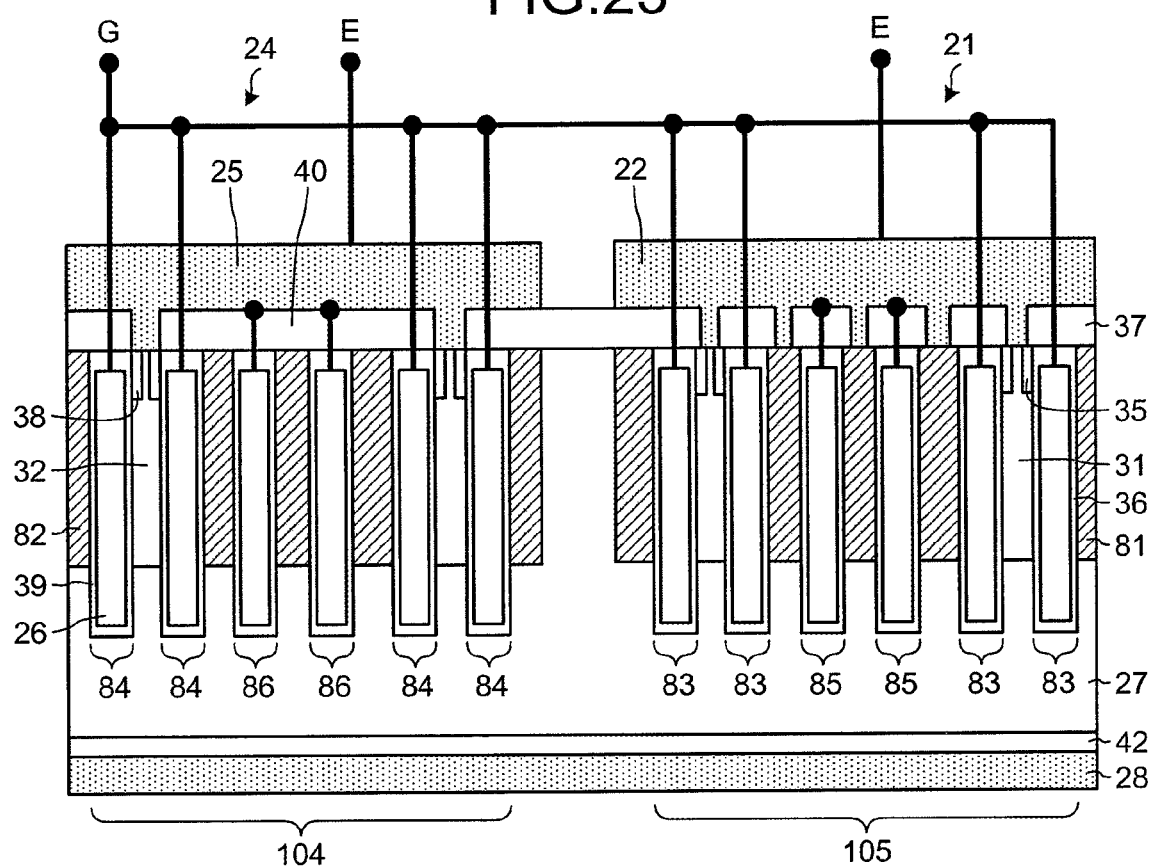
FIG. 23 is a cross-sectional view illustrating a semiconductor device having a current detection function according to a twenty-second embodiment.

FIG. 23 is a cross-sectional view illustrating a semiconductor device having a current detection function according to a twenty-second embodiment. As depicted in FIG. 23, in the twenty-second embodiment, the current detection device 21 has the fifth dummy trench IGBT structure 105 compared with the twentieth and the twenty-first embodiments. In this way, the withstand voltage of the current detection device 21 becomes higher than the main device 24.

Twenty-Third Embodiment

Figure 24:
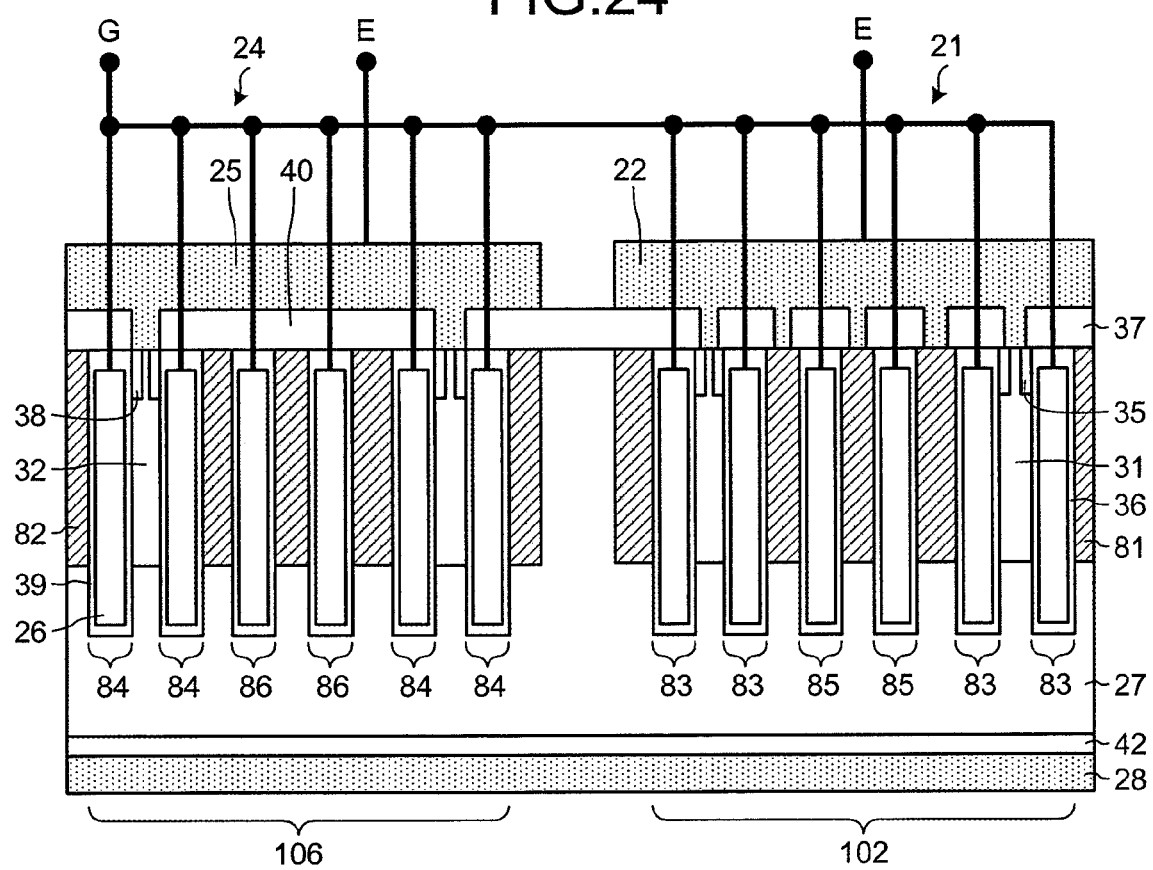
FIG. 24 is a cross sectional view illustrating a semiconductor device having a current detection function according to a twenty-third embodiment.

FIG. 24 is a cross sectional view illustrating a semiconductor device having a current detection function according to a twenty-third embodiment. As depicted in FIG. 24, in the twenty-third embodiment, the main device 24 has the sixth dummy trench IGBT structure 106 compared with the tenth embodiment. A dummy trench electrode 86 of the main device 24 is connected to the trench gate electrodes 83 and 84. Consequently, potential of the dummy trench electrode 86 and the gate terminal G becomes identical. A p-type floating layer 82 is separated from the emitter electrode 25 by the interlayer insulator 40. Therefore, the p-type floating layer 82 is electrically isolated (floating) from the emitter electrode 25. In this way, the withstand voltage of the current detection device 21 becomes higher than the main device 21.

Twenty-Fourth Embodiment

Figure 25:
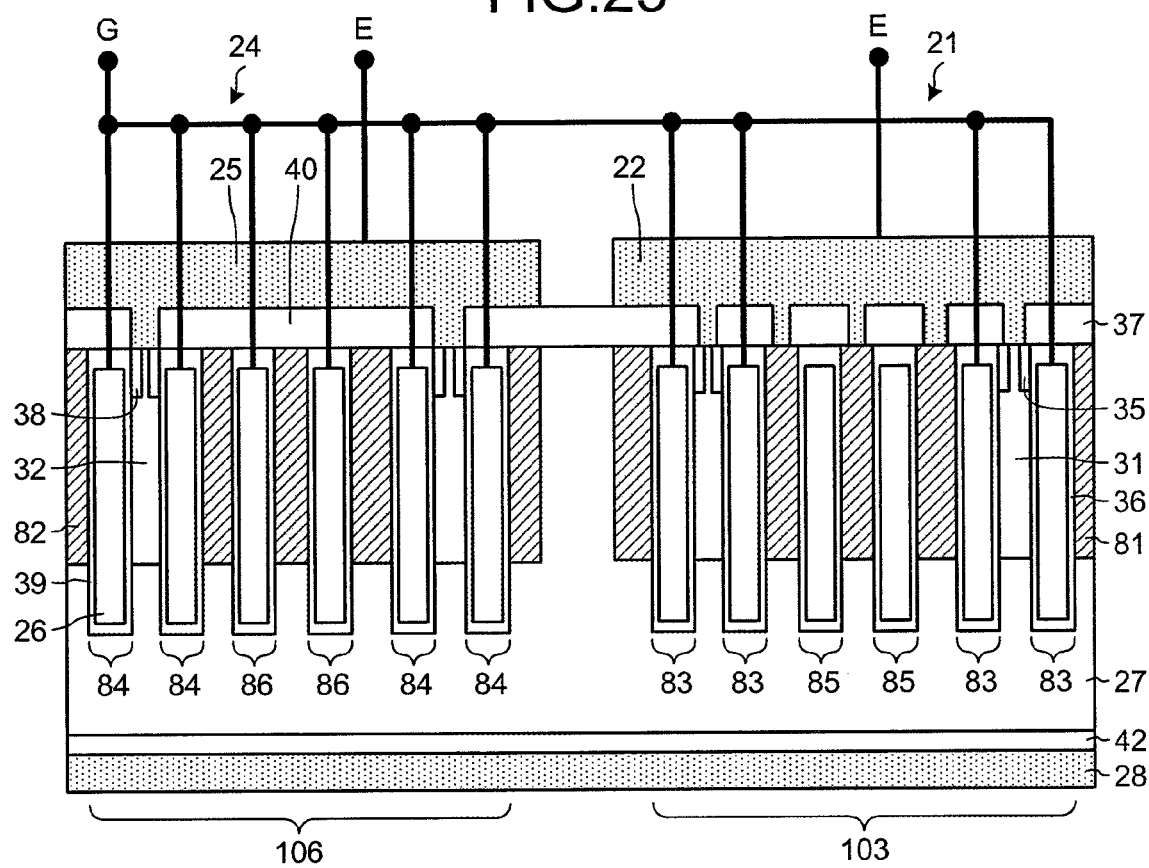
FIG. 25 is a cross-sectional view illustrating a semiconductor device having a current detection function according to a twenty-fourth embodiment.

FIG. 25 is a cross-sectional view illustrating a semiconductor device having a current detection function according to a twenty-fourth embodiment. As depicted in FIG. 25, in the twenty-fourth embodiment, the current detection device 21 has the third dummy trench IGBT structure 103 compared with the twenty-third embodiment. In this way, the withstand voltage of the current detection device 21 becomes higher than the main device 24.

Twenty-Fifth Embodiment

Figure 26:
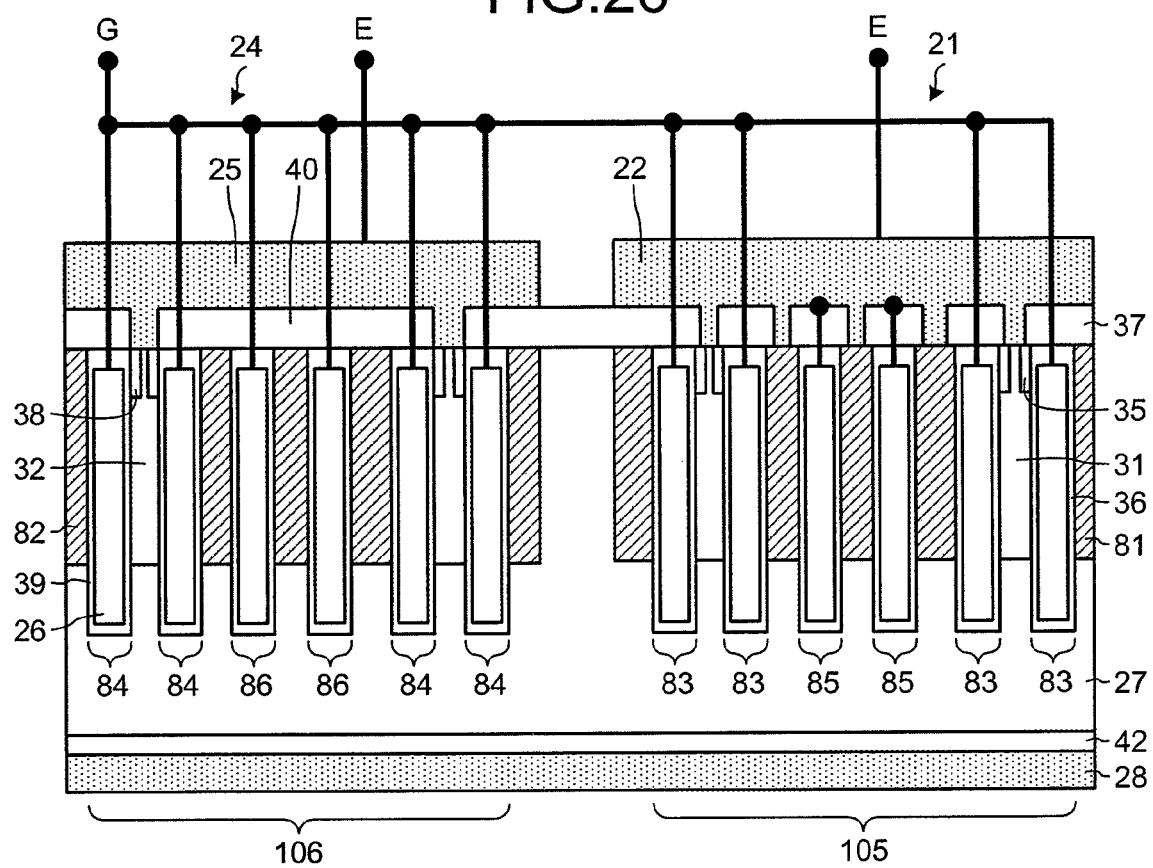
FIG. 26 is a cross-sectional view illustrating a semiconductor device having a current detection function according to a twenty-fifth embodiment.

FIG. 26 is a cross-sectional view illustrating a semiconductor device having a current detection function according to a twenty-fifth embodiment. As depicted in FIG. 26, in the twenty-fifth embodiment, the current detection device 21 has the fifth dummy trench IGBT structure 105 compared with the twenty-fourth embodiment. In this way, the withstand voltage of the current detection device 21 becomes higher than the main device 24.

Twenty-Sixth Embodiment

Figure 27:
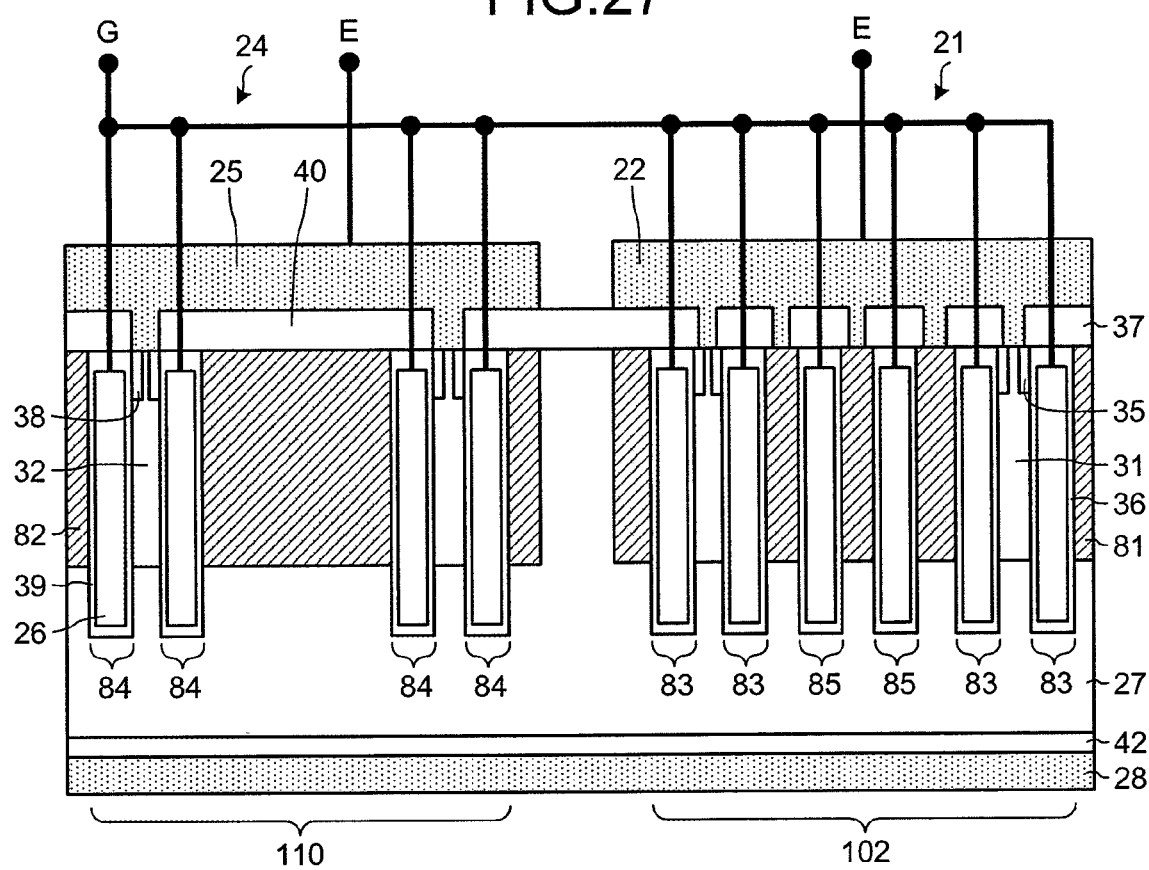
FIG. 27 is a cross-sectional view illustrating a semiconductor device having a current detection function according to a twenty-sixth embodiment.

FIG. 27 is a cross-sectional view illustrating a semiconductor device having a current detection function according to a twenty-sixth embodiment. As depicted in FIG. 27, in the twenty-sixth embodiment, the main device 24 has a trench IGBT structure 110 compared with the tenth embodiment. The main device 24 does not have a dummy trench electrode and has a structure similar to the current detection device 21 depicted in FIG. 8. In this way, the withstand voltage of the current detection device 21 becomes higher than the main device 24.

Twenty-Seventh Embodiment

Figure 28:
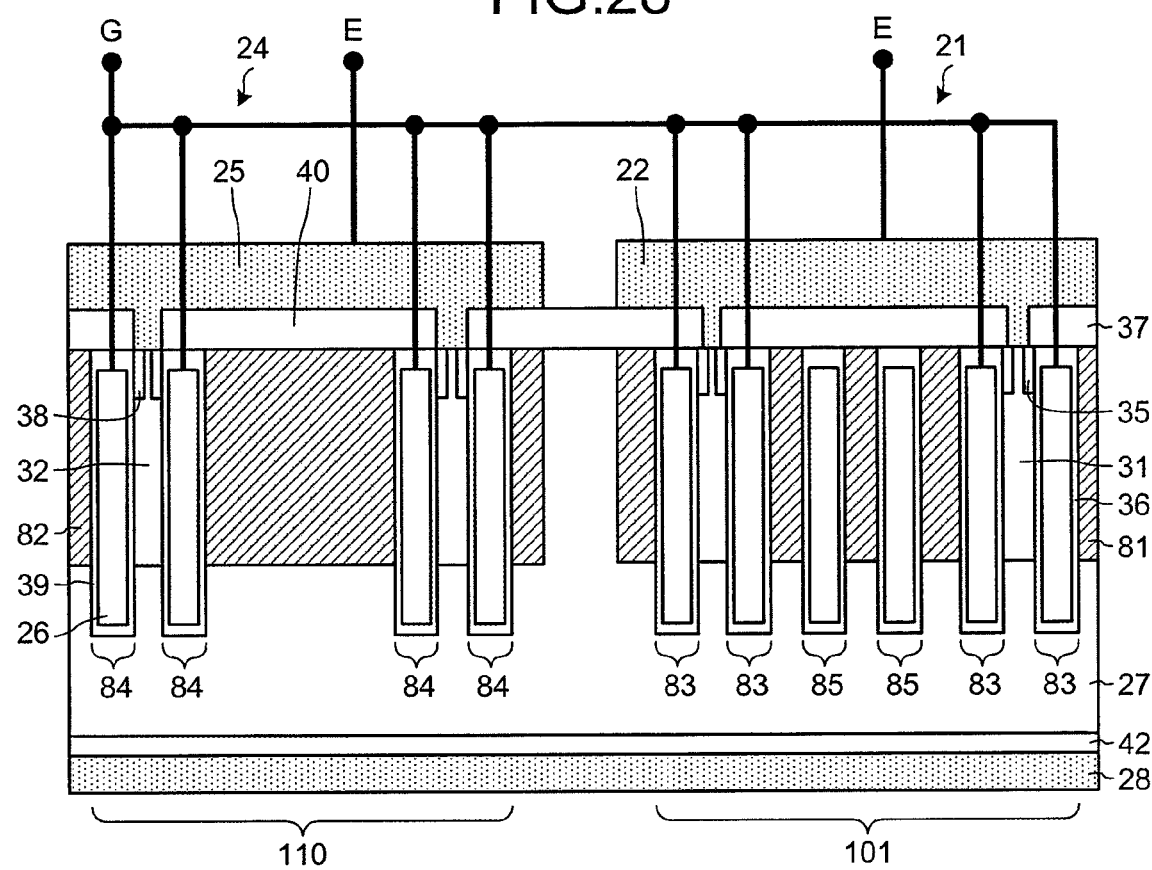
FIG. 28 is a cross-sectional view illustrating a semiconductor device having a current detection function according to a twenty-seventh embodiment.

FIG. 28 is a cross-sectional view illustrating a semiconductor device having a current detection function according to a twenty-seventh embodiment. As depicted in FIG. 28, in the twenty-seventh embodiment, the current detection device 21 has the first dummy trench IGBT structure 101 compared with the twenty-sixth embodiment. A dummy trench electrode 85 of the current detection device 21 is connected to a p-type floating layer 81 in a region that is not depicted. As a result, potential of the current detection device 21 becomes stable. The p-type floating layer 81 is separated from the emitter electrode 22 by the interlayer insulator 37 and is electrically isolated (floating) from the emitter electrode 22. In this way, the withstand voltage of the current detection device 21 becomes higher than the main device 24.

Twenty-Eighth Embodiment

Figure 29:
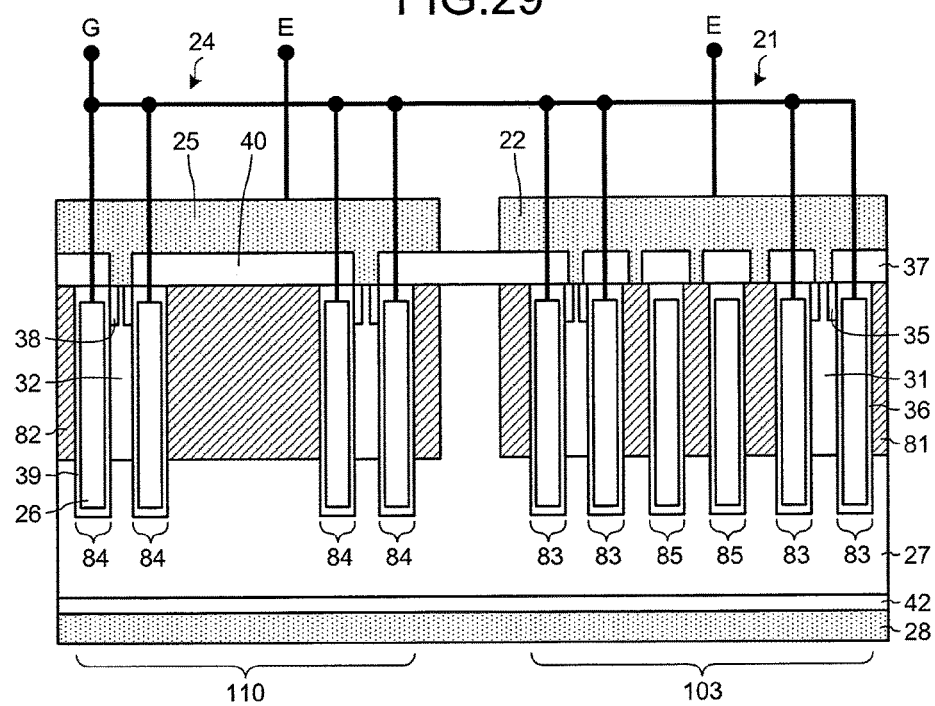
FIG. 29 is a cross-sectional view illustrating a semiconductor device having a current detection function according to a twenty-eighth embodiment.

FIG. 29 is a cross-sectional view illustrating a semiconductor device having a current detection function according to a twenty-eighth embodiment. As depicted in FIG. 29, in the twenty-eighth embodiment, the current detection device 21 has the third dummy trench IGBT structure 103 compared with the twenty-sixth and twenty-seventh embodiments. In this way, the withstand voltage of the current detection device 21 becomes higher than the main device 24.

Twenty-Ninth Embodiment

Figure 30:
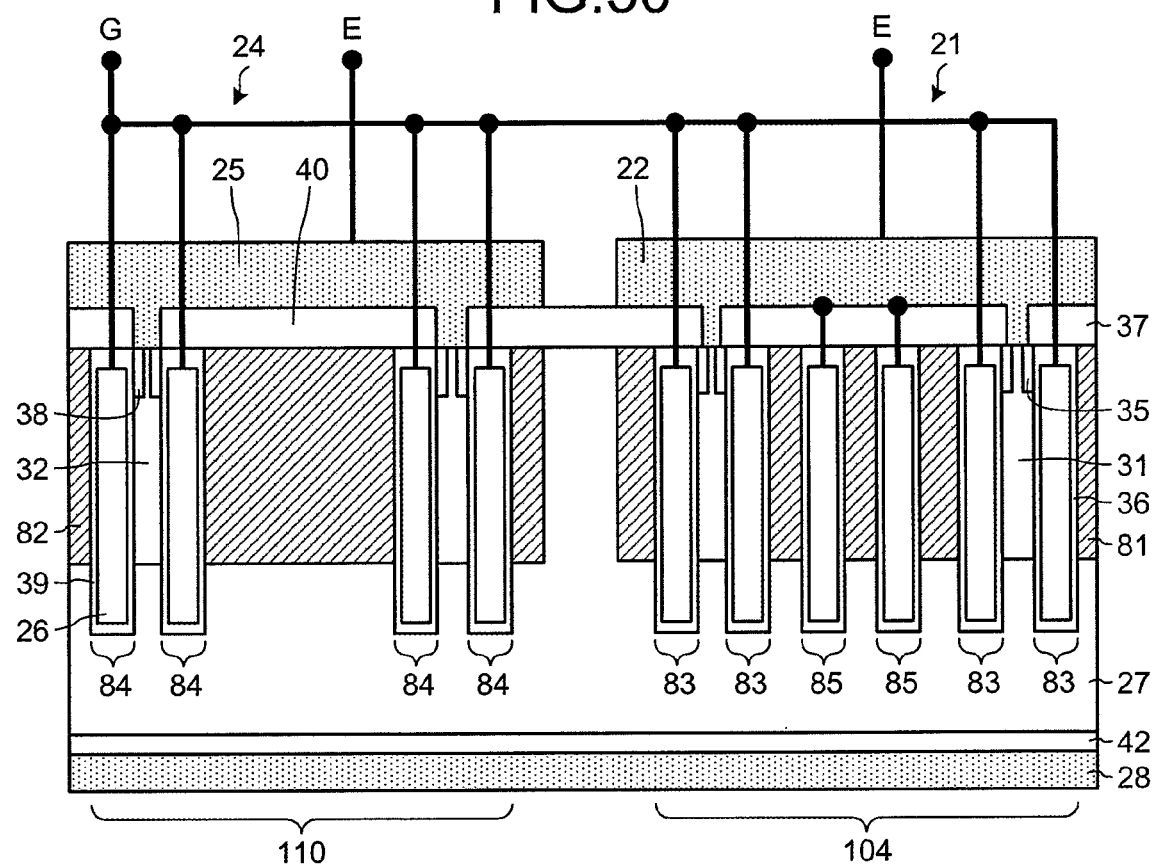
FIG. 30 is a cross-sectional view illustrating a semiconductor device having a current detection function according to a twenty-ninth embodiment.

FIG. 30 is a cross-sectional view illustrating a semiconductor device having a current detection function according to a twenty-ninth embodiment. As depicted in FIG. 30, in the twenty-ninth embodiment, the current detection device 21 has the fourth dummy trench IGBT structure 104 compared with the twenty-sixth to twenty-eighth embodiments. In this way, the withstand voltage of the current detection device 21 becomes higher than the main device 24.

Thirtieth Embodiment

Figure 31:
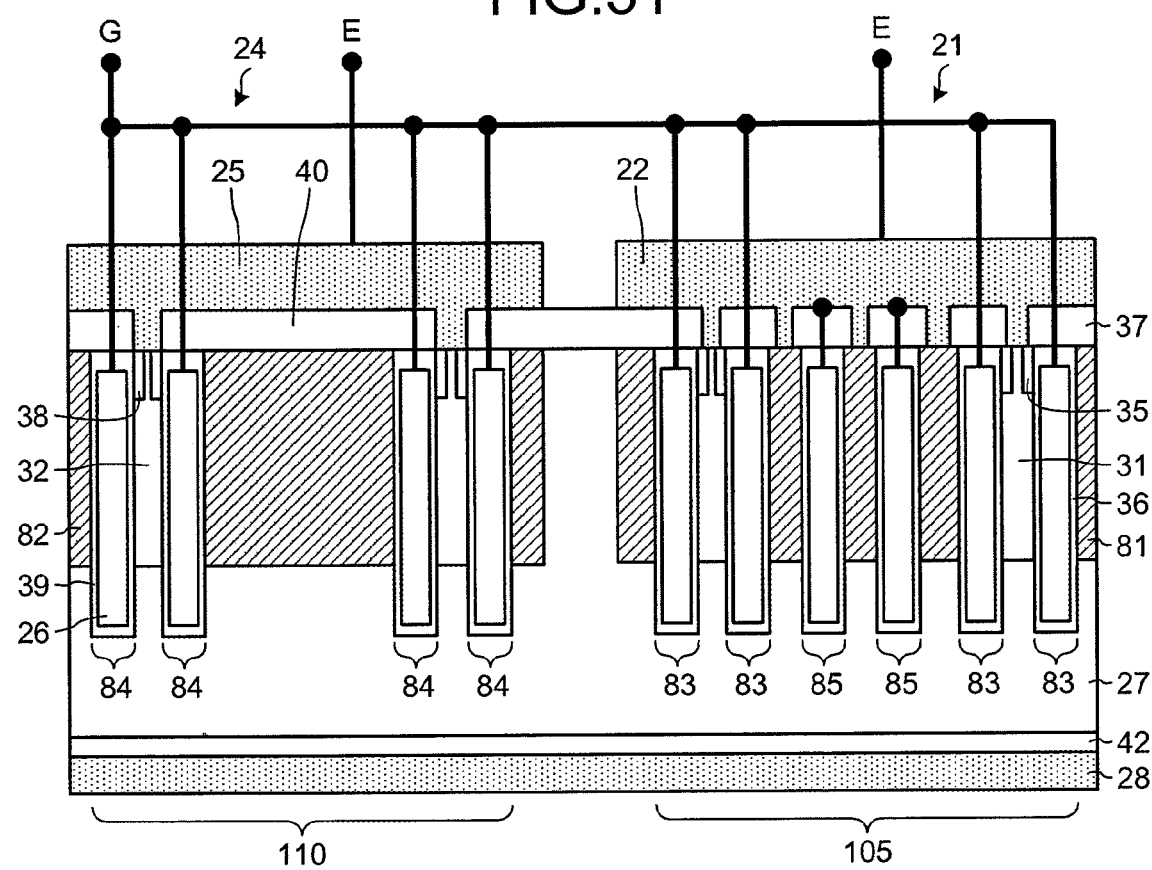
FIG. 31 is a cross-sectional view illustrating a semiconductor device having a current detection function according to a thirtieth embodiment.

FIG. 31 is a cross-sectional view illustrating a semiconductor device having a current detection function according to a thirtieth embodiment. As depicted in FIG. 31, in the thirtieth embodiment, the current detection device 21 has the fifth dummy trench IGBT structure 105 compared with the twenty-sixth to twenty-ninth embodiments. In this way, the withstand voltage of the current detection device 21 becomes higher than the main device 24.

Thirty-First Embodiment

Figure 32:
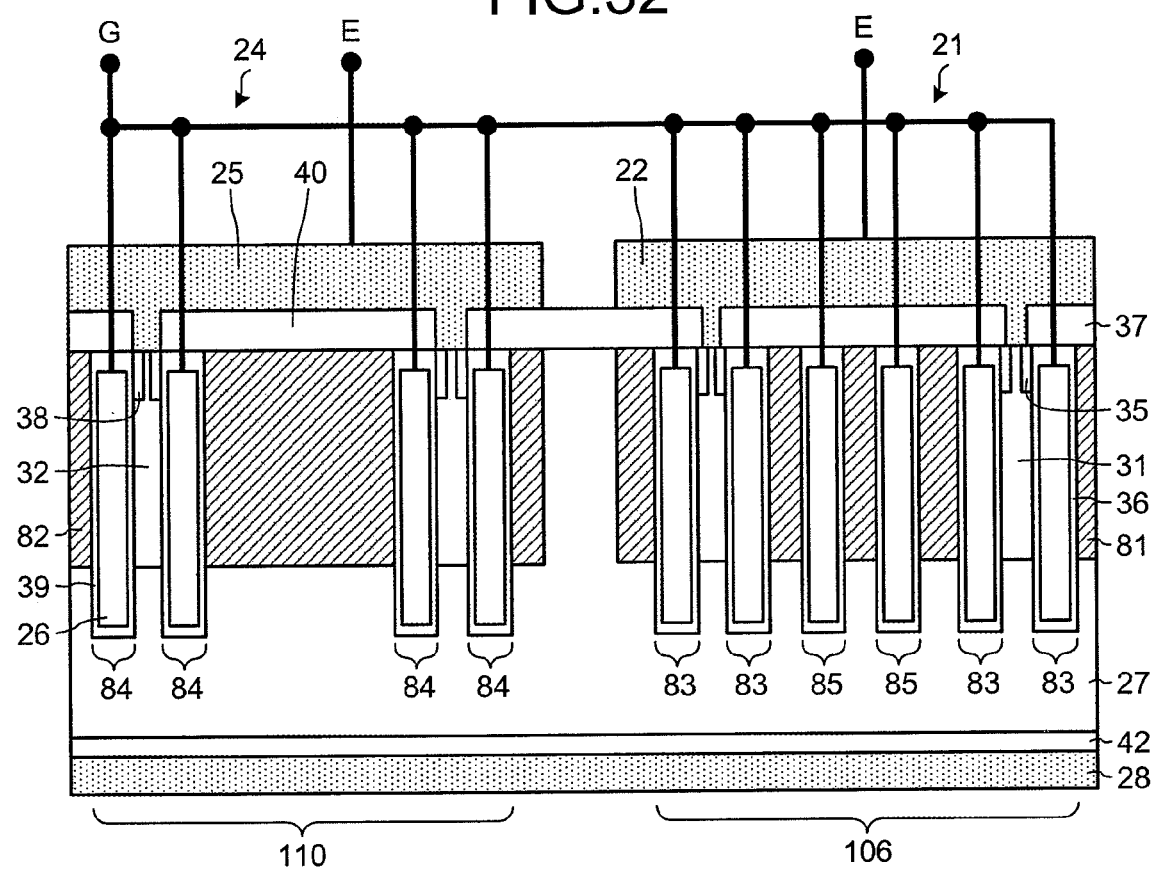
FIG. 32 is a cross-sectional view illustrating a semiconductor device having a current detection function according to a thirty-first embodiment.

FIG. 32 is a cross-sectional view illustrating a semiconductor device having a current detection function according to a thirty-first embodiment. As depicted in FIG. 32, in the thirty-first embodiment, the current detection device 21 has the sixth dummy trench IGBT structure 106 compared with the twenty-sixth to thirtieth embodiments. In this way, the withstand voltage of the current detection device 21 becomes higher than the main device 24.

Thirty-Second Embodiment

Figure 33:
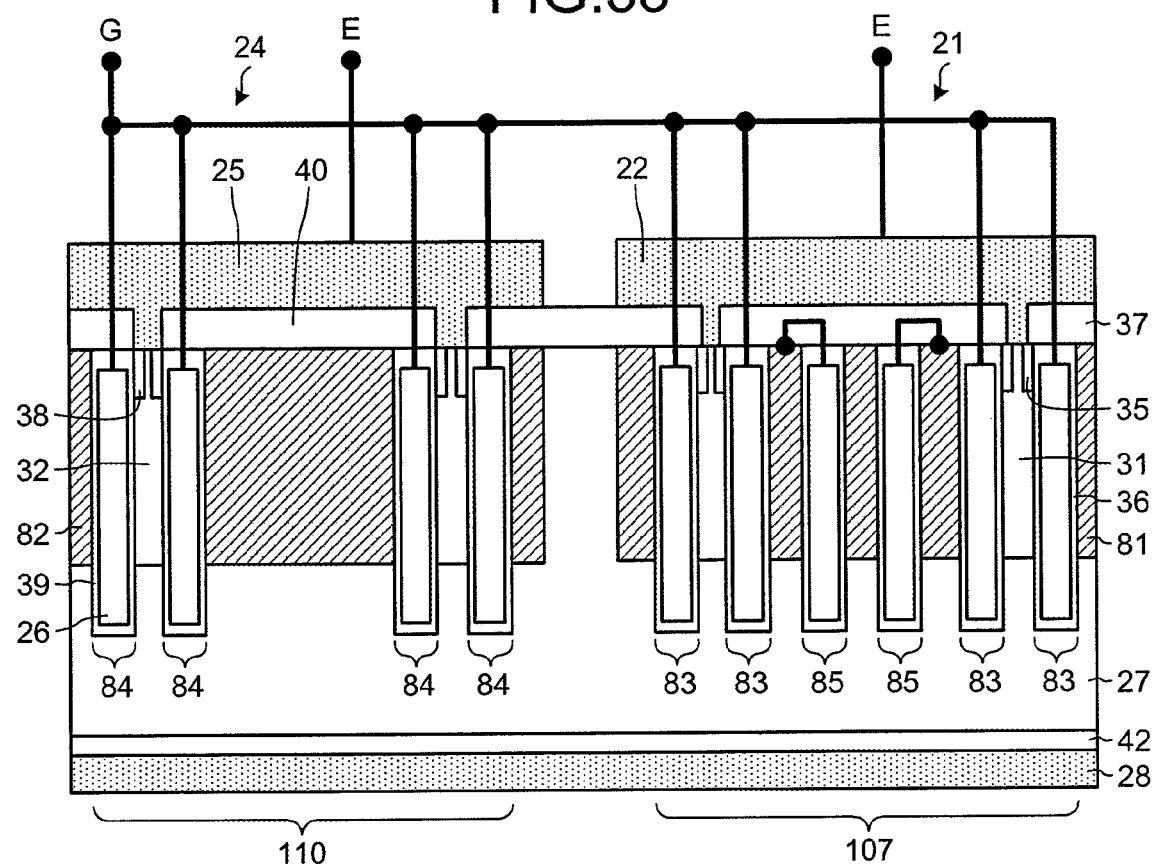
FIG. 33 is a cross-sectional view of a semiconductor device having a current detection function according to a thirty-second embodiment.
Figure 35:
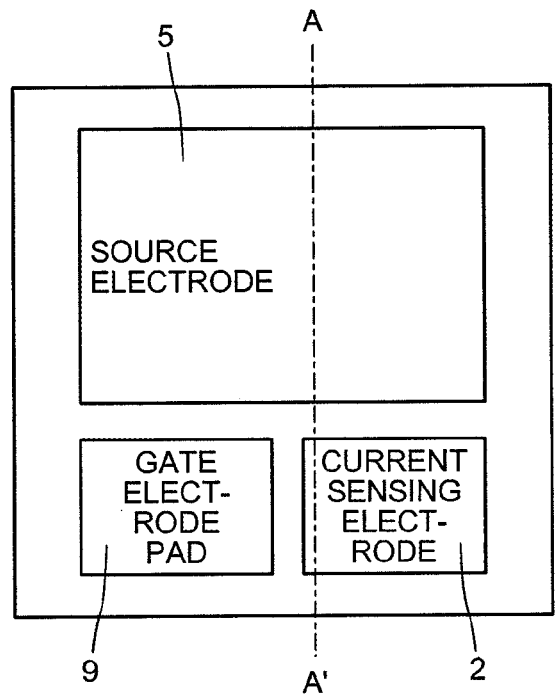
FIG. 35 is a plan view of a semiconductor device with a current detection function.
Figure 36:
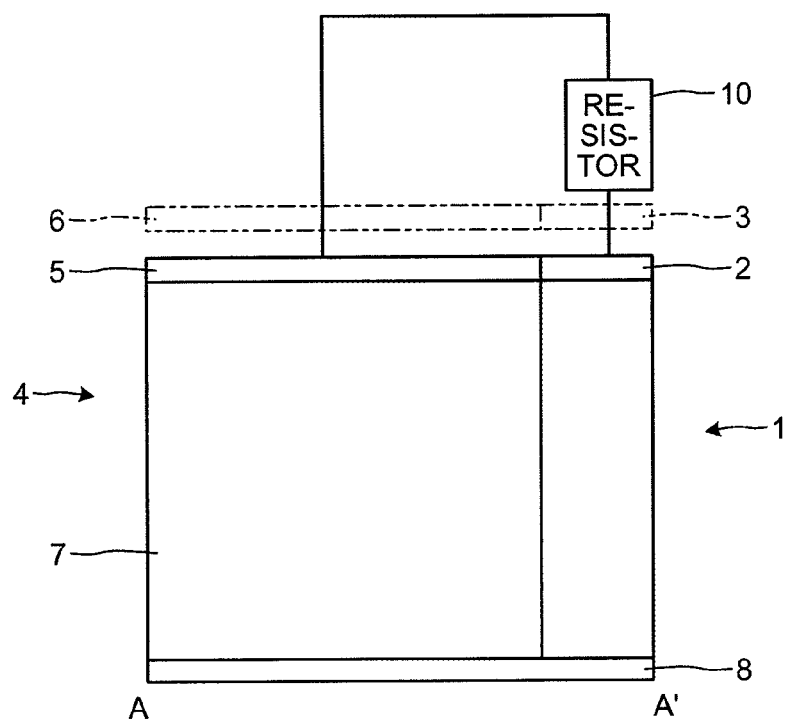
FIG. 36 is a sectional view along a line A-A' depicted in FIG. 35.
Figure 37:
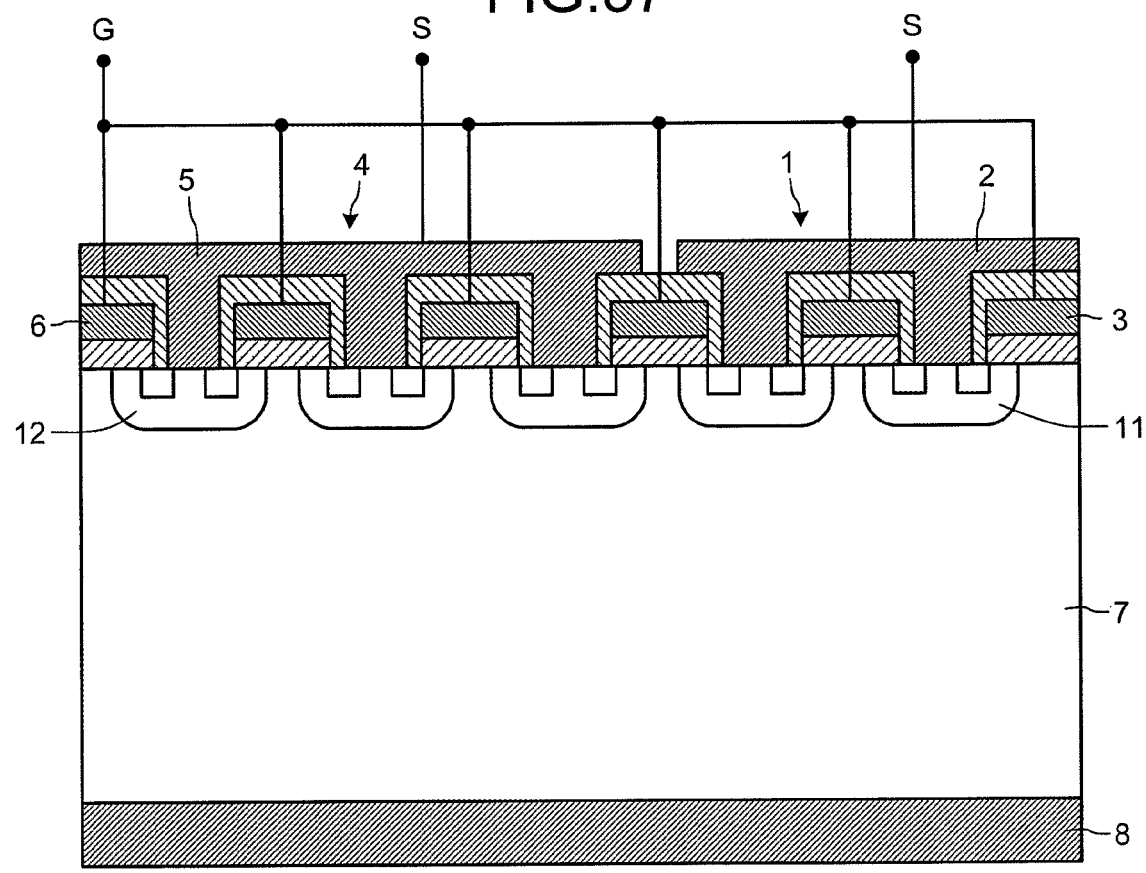
FIG. 37 is a sectional view of a conventional semiconductor device with a current detection function.
Figure 38:
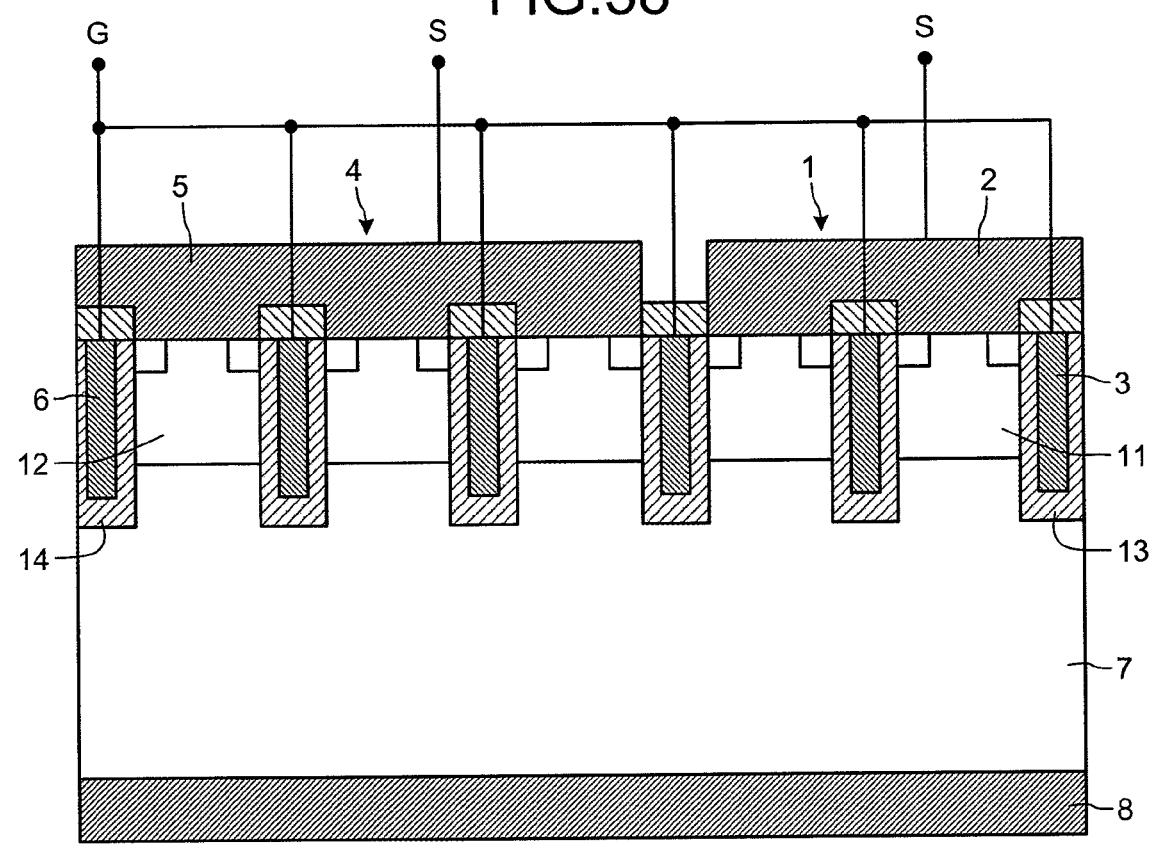
FIG. 38 is a sectional view of another example of a conventional semiconductor device with a current detection function.
Figure 39:
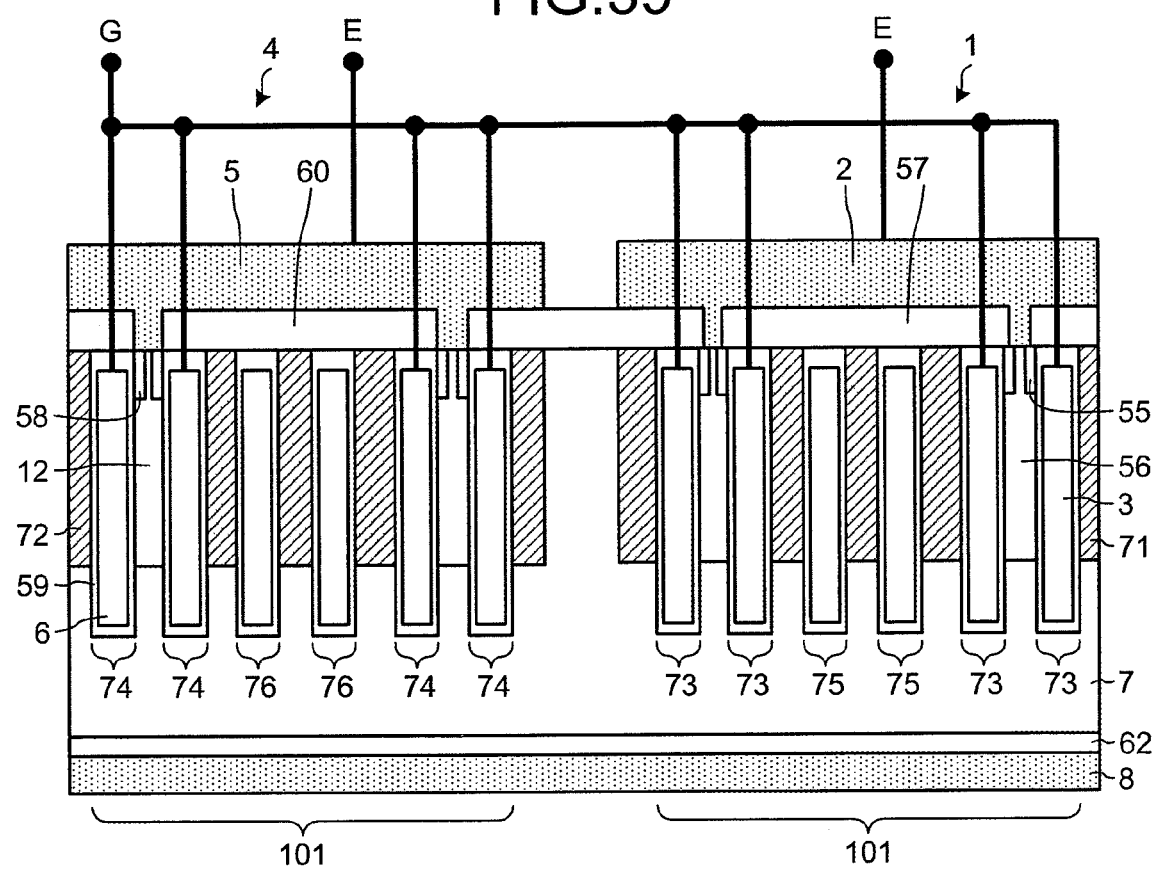
FIG. 39 is a cross-sectional view illustrating a structure of the conventional semiconductor device having a dummy trench structure and a current detection function.

FIG. 33 is a cross-sectional view of a semiconductor device having a current detection function according to a thirty-second embodiment. As depicted in FIG. 33, in the thirty-second embodiment, the current detection device 21 has the seventh dummy trench IGBT structure 107 compared with the twenty-sixth to thirty-first embodiments. A dummy trench electrode 85 of the current detection device 21 is connected to a p-type floating layer 81. It is desirable for the dummy trench electrode 85 to be connected to a p-type floating layer 81 closer to an n$^+$ source region 35 because the withstand voltage of the device rises more. The p-type floating layer 81 is separated from emitter electrode 22 by the interlayer insulator 37 and is connected to the dummy trench electrode 85. In this way, the withstand voltage of the current detection device 21 becomes higher than the main device 24.

EXAMPLE

FIG. 34 is a diagram illustrating relationships between a device structure of IGBT and the withstand voltage of the device. In FIG. 34, the vertical axis indicates the device withstand voltage and the horizontal axis indicates the device structure of IGBT. The device structure of IGBT depicts where a dummy trench electrode and a p-type floating layer are connected.

As depicted in FIG. 34, when a dummy trench electrode is not formed and a p-type floating layer is electrically isolated (floating) (when the main device 24 has a trench IGBT structure that is illustrated in FIGS. 27 to 32), the device withstand voltage is 1240V.

In the case of the first dummy trench IGBT structure 101 applied to the main device 24 as depicted in FIG. 11 to FIG. 15 and to the current detection device 21 as depicted in FIG. 28, and in the case of the seventh dummy trench IGBT structure 107 applied to the main device 24 as depicted in FIG. 16 to FIG. 20 and to the current detection device 21 as depicted in FIG. 33, the device withstand voltage is 1280V.

In the case of the fourth dummy trench IGBT structure 104 applied to the main device 24 as depicted in FIG. 21 to FIG. 23 and to the current detection device 21 as depicted in FIG. 13, FIG. 18, and FIG. 30, and in the case of the sixth dummy trench IGBT structure 106 applied to the main device 24 as depicted in FIG. 24 to FIG. 26 and to the current detection device 21 as depicted in FIG. 15, FIG. 20, and FIG. 32, the device withstand voltage is 1350V.

In the case of the second dummy trench IGBT structure 102 applied to the current detection device 21 as depicted in FIG. 11, FIG. 16, FIG. 21, FIG. 24, and FIG. 27, in the case of the third dummy trench IGBT structure 103 applied to the current detection device 21 as depicted in FIG. 12, FIG. 17, FIG. 22, FIG. 25, and FIG. 29, and in the case of the fifth dummy trench IGBT structure 105 applied to the current detection device 21 as depicted in FIG. 14, FIG. 19, FIG. 23, FIG. 26, and FIG. 31, the device withstand voltage is 1370V.

As explained above, in the tenth to thirty-second embodiments, it is noted that the withstand voltage of the current detection device 24 is higher than the main device 24. As a result, even when large surge voltage occurs because of, for example, a switching operation of the IGBT, loads and currents do not build up in the current detection device. Therefore, even if overcurrent flows through the main device, the current detection device is not destroyed and thus, the current detection device can detect overcurrent flowing through the main device. Consequently, an operation of the device can be stopped or a protection circuit can be activated before the main device is destroyed, thereby improving reliability of the device.

The above exemplary embodiments may further be modified. For example, although a first conductivity type is an n-type and a second conductivity type is a p-type in the above embodiments, the first conductivity type may be a p-type and the second conductivity type may be an n-type. The main device 24 and the current detection device 21 may be formed separately on different semiconductor chips so that a semiconductor device with a current detection function includes two or more chips. In this case, the drain terminal (collector terminal) of the main device 24 and the drain terminal (collector terminal) of the current detection device 21 are electrically connected through external wiring.

INDUSTRIAL APPLICABILITY

As explained above, a semiconductor device according to the invention is of use for a power semiconductor device, especially, for a MOSFET or IGBT for a vehicle.

The invention claimed is:
1. A semiconductor device that detects current in a main insulated-gate semiconductor device element by a potential difference, the semiconductor device, comprising:
 the main insulated-gate semiconductor device element;

a current-detecting insulated-gate semiconductor device element having a size smaller than a size of the main insulated-gate semiconductor device element; and a resistor connected between the main insulated-gate semiconductor device element and the current-detecting insulated-gate semiconductor device element, the resistor having the potential difference between ends thereof, wherein the current-detecting insulated-gate semiconductor device element, under reverse bias, has a breakdown voltage higher than a breakdown voltage of the main insulated-gate semiconductor device element under reverse bias, the main insulated-gate semiconductor device element has:
- a first first-conductivity-type semiconductor layer having a first main surface and a second main surface opposite to each other,
- a first second-conductivity-type semiconductor region provided in the first first-conductivity-type semiconductor layer at the first main surface,
- a first first-conductivity-type high-concentration semiconductor region selectively provided in the first second-conductivity-type semiconductor region at a surface of the first second-conductivity-type semiconductor region,
- a first gate electrode provided, via a first gate insulating film, in a first trench that penetrates the first first-conductivity-type high-concentration semiconductor region and the first second-conductivity-type semiconductor region and reaches the first first-conductivity-type semiconductor layer,
- a first electrode in contact with the first first-conductivity-type high-concentration semiconductor region and the first second-conductivity-type semiconductor region, and
- a second electrode provided facing the second main surface of the first first-conductivity-type semiconductor layer, and the current-detecting insulated-gate semiconductor device element has:
- a second first-conductivity-type semiconductor layer having a first main surface and a second main surface opposite to each other,
- a second second-conductivity-type semiconductor region provided in the second first-conductivity-type semiconductor layer at the first main surface of the second first-conductivity-type semiconductor layer,
- a second first-conductivity-type high-concentration semiconductor region selectively provided in the second second-conductivity-type semiconductor region at a surface of the second second-conductivity-type semiconductor region,
- a second gate electrode provided, via a second gate insulating film, in a second trench that penetrates the second first-conductivity-type high-concentration semiconductor region and the second second-conductivity-type semiconductor region and reaches the second first-conductivity-type semiconductor layer,
- a third electrode in contact with the second first-conductivity-type high-concentration semiconductor region and the second second-conductivity-type semiconductor region, and
- a fourth electrode provided facing the second main surface of the second first-conductivity-type semiconductor layer.

2. The semiconductor device according to claim 1, wherein
the resistor is connected between the first electrode and the third electrode,
the second electrode and the fourth electrode are short-circuited,
the first second-conductivity-type semiconductor region is divided into a plurality of regions by the first trench, one of the regions is floating electrically from the first electrode,
a short-circuit ratio of the second second-conductivity-type semiconductor region with the third electrode is higher than a short-circuit ratio of the first second-conductivity-type semiconductor region with the first electrode.

3. The semiconductor device according to claim 1, wherein
the resistor is connected between the first electrode and the third electrode,
the second electrode and the fourth electrode are short-circuited, and
the first trench has a width that is less than a width of the second trench.

4. The semiconductor device according to claim 1, wherein
the resistor is connected between the first electrode and the third electrode,
the second electrode and the fourth electrode are short-circuited, and
a diffusion depth of the first second-conductivity-type semiconductor region is shallower than a diffusion depth of the second second-conductivity-type semiconductor region.

5. The semiconductor device according to claim 1, wherein
the resistor is connected between the first electrode and the third electrode,
the second electrode and the fourth electrode are short-circuited, and
the first trench is deeper than the second trench.

* * * * *